United States Patent
Shirasaki et al.

(10) Patent No.: US 7,576,358 B2
(45) Date of Patent: Aug. 18, 2009

(54) DISPLAY PANEL

(75) Inventors: Tomoyuki Shirasaki, Higashiyamato (JP); Tadahisa Tohyama, Akishima (JP); Jun Ogura, Fussa (JP)

(73) Assignee: Casio Computer Co., Ltd., Tokyo (JP)

( * ) Notice: Subject to any disclaimer, the term of this patent is extended or adjusted under 35 U.S.C. 154(b) by 378 days.

(21) Appl. No.: 11/232,743

(22) Filed: Sep. 22, 2005

(65) Prior Publication Data

US 2006/0066534 A1    Mar. 30, 2006

(30) Foreign Application Priority Data

Sep. 29, 2004 (JP) ............................. 2004-283519

(51) Int. Cl.
*H01L 27/15* (2006.01)

(52) U.S. Cl. ................. 257/59; 257/E27.132

(58) Field of Classification Search ............... 257/59, 257/258, 444, E27.13, E27.132
See application file for complete search history.

(56) References Cited

U.S. PATENT DOCUMENTS

| 4,980,775 | A | 12/1990 | Brody |
| 6,522,315 | B2* | 2/2003 | Ozawa et al. ................. 345/92 |
| 6,734,636 | B2* | 5/2004 | Sanford et al. ........... 315/169.3 |
| 2001/0055828 | A1 | 12/2001 | Kaneko et al. |
| 2002/0195968 | A1 | 12/2002 | Sanford et al. |
| 2002/0196206 | A1* | 12/2002 | Kimura et al. ................. 345/44 |
| 2004/0032202 | A1* | 2/2004 | Fukunaga ................... 313/495 |
| 2004/0113873 | A1* | 6/2004 | Shirasaki et al. .............. 345/76 |

FOREIGN PATENT DOCUMENTS

| CN | 1217807 A | 5/1999 |
| JP | 8-330600 A | 12/1996 |
| JP | 2002-318556 A | 10/2002 |
| JP | 2003-186420 A | 7/2003 |
| KR | 2003-77461 A | 10/2003 |
| TW | 573167 A4 | 1/2004 |

(Continued)

OTHER PUBLICATIONS

Japanese Office Action dated Nov. 11, 2008, issued in counterpart Japanese Application No. 2004-283519, and English translation thereof.

(Continued)

*Primary Examiner*—Minh-Loan T Tran
*Assistant Examiner*—W. Wendy Kuo
(74) *Attorney, Agent, or Firm*—Frishauf, Holtz, Goodman & Chick, P.C.

(57) ABSTRACT

A display panel includes a plurality of sets of transistors which are formed on an upper side of a substrate. An insulating film is formed to cover upper surfaces of the transistors and has a plurality of trenches formed in an upper surface thereof. A plurality of first interconnections are buried in the trenches. An interconnection insulating film covers upper surfaces of the first interconnections. A plurality of second interconnections are provided on an upper side of the interconnection insulating film. Each of a plurality of pixel electrodes is provided between two adjacent interconnections of the second interconnections. Each of a plurality of light-emitting layers is provided on one of the pixel electrodes. A counter electrode is provided on the light-emitting layers.

10 Claims, 16 Drawing Sheets

FOREIGN PATENT DOCUMENTS

| | | |
|---|---|---|
| TW | 582184 A4 | 4/2004 |
| TW | 586091 | 5/2004 |
| TW | 591574 A4 | 6/2004 |
| TW | 591578 | 6/2004 |
| TW | 1 235986 | 7/2005 |
| TW | 1 237224 | 8/2005 |

OTHER PUBLICATIONS

Chinese Office Action (and English translation thereof) dated Jun. 27, 2008, issued in a counterpart Chinese Application.

* cited by examiner

DISPLAY PANEL

CROSS-REFERENCE TO RELATED APPLICATIONS

This application is based upon and claims the benefit of priority from prior Japanese Patent Application No. 2004-283519, filed Sep. 29, 2004, the entire contents of which are incorporated herein by reference.

BACKGROUND OF THE INVENTION

1. Field of the Invention

The present invention relates to a display panel and, more particularly, to a display panel using light-emitting elements.

2. Description of the Related Art

In recent years, as display apparatuses using new video display methods replacing cathode ray tubes (CRTs), liquid crystal displays (LCDs) using liquid crystal panels, EL displays using electroluminescence (EL) phenomenon, and plasma displays using plasma display panels (to be referred to as PDPs hereinafter) have been developed.

EL displays are roughly classified into inorganic EL displays using an inorganic compound for electroluminescent elements (to be referred to as EL elements hereinafter) and organic EL displays using an organic compound. Development of organic EL displays is progressing because they allow easy manufacturing of color displays and can also operate at low voltages as compared to inorganic EL displays.

Organic EL display panels used in the organic EL displays can be driven by a passive driving method or an active matrix driving method. Organic EL display panels which employ the active matrix driving method are more excellent than those of the passive driving method because of high contrast and high resolution.

In a conventional organic electroluminescent display panel using the active matrix driving method described in, e.g., Jpn. Pat. Appln. KOKAI Publication No. 8-330600, an organic EL element, a driving transistor which supplies a current to the organic EL element when a voltage signal corresponding to image data is applied to the gate, and a switching transistor which performs switching to supply the voltage signal corresponding to image data to the gate of the driving transistor are arranged for each pixel. In this organic EL display panel, when a scan line is selected, the switching transistor is turned on. In a moment, a voltage of level representing the luminance is applied to the gate of the driving transistor through a signal line. The driving transistor is turned on. A driving current having a magnitude corresponding to the level of the gate voltage is supplied from the power supply to the organic EL element through the source-to-drain path of the driving transistor. The organic EL element emits light at a luminance corresponding to the magnitude of the current. During the period from the end of scan line selection to the next scan line selection, the level of the gate voltage of the driving transistor is continuously held even after the switching transistor is turned off. Hence, the organic EL element emits light at a luminance corresponding to the magnitude of the driving current.

In the above-described organic EL display panel, a voltage drop or a signal delay through interconnections occurs due to the electrical resistance of an interconnection such as a power supply line which supplies a current to a plurality of organic EL elements simultaneously. As a measure to suppress the voltage drop or signal delay, a method of reducing the resistance of the interconnection by increasing the thickness or width of the interconnection has been examined. This interconnection is formed by using the gate metal or source/drain metal of a thin-film transistor such as a driving transistor to operate an organic EL element. However, the thickness of an electrode of a thin-film transistor is designed in accordance with the required characteristic. In other words, the electrode is not designed assuming that it supplies a current to a light-emitting element. Hence, if a current is supplied from the interconnection to a plurality of light-emitting elements simultaneously, a voltage drop occurs, or the current flow through the interconnection delays due to the electrical resistance of the interconnection. To suppress the voltage drop or interconnection delay, the resistance of the interconnection is preferably low. If the resistance of the interconnection is reduced by patterning a metal layer serving as the source and drain electrodes of the transistor or a metal layer serving as the gate electrode considerably wide to sufficiently flow the current, the overlap area of the interconnection on another interconnection or conductor when viewed from the upper side increases, and a parasitic capacitance is generated between them. This retards the flow of the current. Alternatively, in a so-called bottom emission structure which emits EL light from the transistor array substrate side, light emitted from the EL elements is shielded by the interconnections, resulting in a decrease in opening ratio, i.e., the ratio of the light emission area. If the gate electrode of the thin-film transistor is made thick to lower the resistance, the etching accuracy becomes low. In addition, a planarization film (corresponding to a gate insulating film when the thin-film transistor has, e.g., an inverted stagger structure) to eliminate the step of the gate electrode must also be formed thick. This may lead to a large change in transistor characteristic. When the source and drain electrodes are formed thick, the etching accuracy of the source and drain electrodes degrades. This may also adversely affect the transistor characteristic.

BRIEF SUMMARY OF THE INVENTION

It is an object of the present invention to provide a display panel capable of suppressing any voltage drop and current signal delay.

A display panel according to an aspect of the present invention comprises:

a substrate;

a plurality of sets of transistors which are formed on upper side of the substrate;

an insulating film which is formed to cover upper surfaces of said plurality of transistors and has a plurality of trenches formed an upper surface thereof;

a plurality of first interconnections which are buried in the trenches;

an interconnection insulating film which covers upper surfaces of said plurality of first interconnections;

a plurality of second interconnections which are provided on an upper side of the interconnection insulating film;

a plurality of pixel electrodes each of which is provided between adjacent two of said plurality of second interconnections;

a plurality of light-emitting layers each of which is provided on the pixel electrode; and a counter electrode which is provided on the light-emitting layer.

The transistors of each set may include a driving transistor in which one of a source and drain is connected to the pixel electrode, a switch transistor which supplies a write current between the source and the drain of the driving transistor, and a holding transistor which holds a voltage between the source and a gate of the driving transistor during a light emission period.

The first interconnection preferably includes a feed interconnection which is connected to the other of the source and drain of the driving transistor. The first interconnection may be formed from a conductive layer different from a conductive layer serving as gate of each of the transistors and a conductive layer serving as the source and drain of each transistor.

The first interconnection may include a conductive line formed by patterning a conductive layer serving as the pixel electrode. Preferably, the insulating film has a transistor protective insulating film which directly covers the transistors. The insulating film preferably has a planarization film which is provided on the transistor protective insulating film.

The second interconnection may be connected to the counter electrode. A running direction of the second interconnection is preferably perpendicular to a running direction of the first interconnection.

Preferably, the second interconnection is formed from a conductive layer different from a conductive layer serving as the gate of each of said plurality of transistors and a conductive layer serving as source and drain of each transistor.

A display panel according to a second aspect of the present invention comprises:

a substrate on which a plurality of pixels each having a plurality of sub-pixels are arranged;

a plurality of driving transistors each of which is arranged for each sub-pixel on an upper side of the substrate;

a plurality of switch transistors each of which is arranged for each sub-pixel on the upper side of the substrate so as to electrically connect one of a source and drain to one of a source and drain of the driving transistor;

a plurality of holding transistors each of which is arranged for each sub-pixel on the upper side of the substrate so as to electrically connect one of a source and drain to the other of the source and drain of the driving transistor and the other of the source and drain to a gate of the driving transistor;

an insulating film which is formed to cover the driving transistors, the switch transistors, and the holding transistors and has a plurality of trenches formed in an upper surface thereof;

a plurality of feed interconnections each which is buried in the trench, electrically connected to the other of the source and drain of the driving transistor, and formed from a conductive layer different from a conductive layer serving as the gates, sources, and drains of the driving transistor, switch transistor, and holding transistor;

a plurality of ridges which are formed on an upper side of the insulating film in parallel to each other;

a plurality of sub-pixel electrodes each of which is arrayed on the upper side of the insulating film along the ridges, provided between the ridges in correspondence with each sub-pixel, and electrically connected to one of the source and drain of the driving transistor;

a light-emitting layer which is formed on an upper surface of the sub-pixel electrode by wet coating; and a counter electrode which covers the light-emitting layer.

The ridge may be made of a photosensitive insulating resin. Preferably, a plurality of signal lines are provided under the ridges and overlap the ridges when viewed from an upper side. A thickness of the feed interconnection may be 1.31 to 6.00 μm. A width of the feed interconnection may be 7.45 to 44.00 μm. A resistivity of the feed interconnection may be 2.1 to 9.6 μΩcm.

According to the display panel of the present invention, the first interconnection may be buried in the trench formed in the protective insulating film which covers the upper surfaces of the plurality of transistors. When the first interconnection is made thick, the resistance can be reduced. Hence, any voltage drop and current signal delay can be suppressed.

According to another display of the present invention, in each pixel, the feed interconnection buried in the trench formed in the protective insulating film may be formed from a layer different from the conductive layer used for the electrodes of the switch transistor, holding transistor, and driving transistor. When the feed interconnection is made thick, the resistance of the feed interconnection can be reduced. Hence, even when a signal is output to the switch transistor, holding transistor, and driving transistor through the feed interconnection, any voltage drop and current signal delay can be suppressed.

DETAILED DESCRIPTION OF THE INVENTION

The best mode for carrying out the present invention will be described below with reference to the accompanying drawing. Various kinds of limitations which are technically preferable in carrying out the present invention are added to the embodiments to be described below. However, the spirit and scope of the present invention are not limited to the following embodiments and illustrated examples.

A display panel according to one embodiment of the present invention will be described with reference to FIGS. 1 to 16.

First, the planar structure of the display panel will be described.

Figure 1:
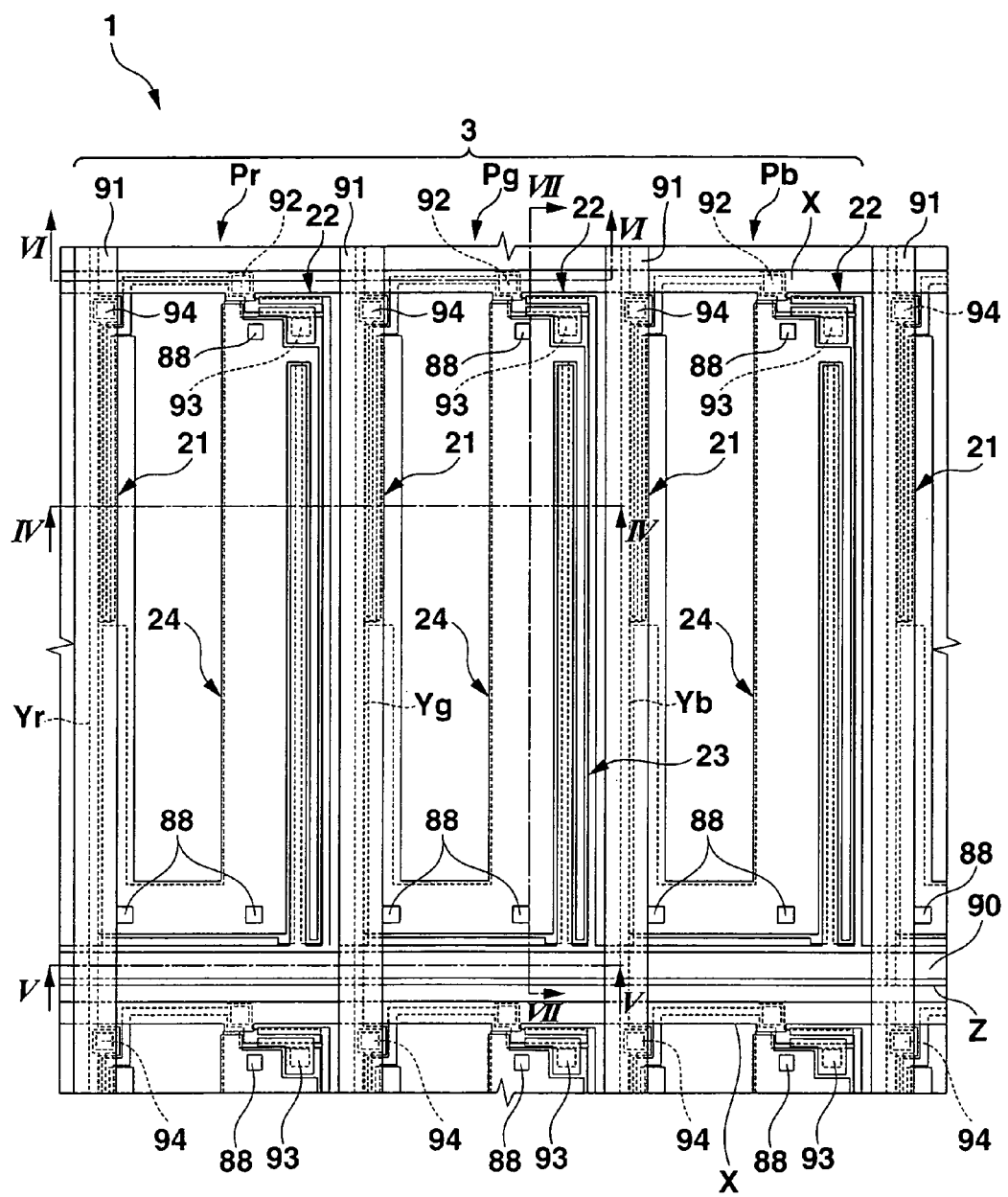
FIG. 1 is a plan view showing a pixel in a display apparatus according to the present invention.

As shown in FIG. 1, a display panel 1 according to this embodiment has a plurality of pixels 3 arranged in a matrix. Each pixel 3 includes a 1-dot red sub-pixel Pr, 1-dot green sub-pixel Pg, and 1-dot blue sub-pixel Pb each having an almost rectangular shape. The sub-pixels Pr, Pg, and Pb are arrayed in the pixel 3 while setting their longitudinal directions (to be referred to as a vertical direction hereinafter) in parallel. The red sub-pixel Pr, green sub-pixel Pg, and blue sub-pixel Pb are arrayed in this order in a direction (to be referred to as a horizontal direction hereinafter) perpendicular to the longitudinal direction.

In the following description, an arbitrary one of the red sub-pixel Pr, green sub-pixel Pg, and blue sub-pixel Pb is represented by a sub-pixel P. The description of the sub-pixel P applies to all the red sub-pixel Pr, green sub-pixel Pg, and blue sub-pixel Pb.

As shown in FIG. 1, a signal line Yr is arranged between a column of red sub-pixels Pr (only one pixel is typically shown is this figure) and a column of blue sub-pixels Pb in the vertical direction. A signal line Yg is arranged between a column of green sub-pixels Pg and a column of red sub-pixels Pr in the vertical direction. A signal line Yb is arranged between a column of blue sub-pixels Pb and a column of green sub-pixels Pg in the vertical direction. Placing a focus on the array sequence in the horizontal direction, the signal lines Yr, Yg, and Yb are arrayed repeatedly in this order. The signal lines Yr, Yg, and Yb run in the vertical direction in parallel.

The signal lines Yr, Yg, and Yb are designed and arranged to supply signals to all red sub-pixels Pr, all green sub-pixels Pg, and all blue sub-pixels Pb, which are arrayed in line in the vertical direction.

In the following description, a signal line Y represents the signal line Yr in FIG. 1 for the red sub-pixel Pr, the signal line Yg in FIG. 1 for the green sub-pixel Pg, and the signal line Yb in FIG. 1 for the blue sub-pixel Pb. The description of the signal line Y applies to all the signal lines Yr, Yg, and Yb.

The number of signal lines Y is $n$. Signal lines $Y_1$ to $Y_n$ running in the vertical direction (column direction) are perpendicular to $m$ scan lines $X_1$ to $X_m$, $m$ feed interconnections 90, and $m$ supply lines $Z_1$ to $Z_m$ running in the horizontal direction (row direction), where $m$ and $n$ are natural numbers ($m \geq 2$, $n \geq 2$), and $n$ is a multiple of 3. The subscript added to a scan line X represents the sequence from the top in FIGS. 8 and 10. The subscript added to a supply line Z represents the sequence from the top in FIGS. 8 and 10. The subscript added to the signal line Y represents the sequence from the left in FIGS. 8 and 10. The first subscript added to the sub-pixel P represents the sequence from the top, and the second subscript represents the sequence from the left. More specifically, let $i$ be an arbitrary natural number of 1 to $m$, and $j$ be an arbitrary natural number of 1 to $n$. A scan line $X_i$ is the ith row from the top, a supply line $Z_i$ is the ith row from the top, a signal line $Y_j$ is the jth column from the left, and a sub-pixel $P_{i,j}$ is located on the ith row from the top and the jth column from the left. The sub-pixel $P_{i,j}$ is connected to the scan line $X_i$, supply line $Z_i$, and signal line $Y_j$. More specifically, the plurality of scan lines X run in the horizontal direction on the upper side of the pixels 3 in the vertical direction. The plurality of supply lines Z and the plurality of feed interconnections 90 are arranged on the lower side of the pixels 3 opposite to the scan lines X while being in parallel to the scan lines X. Placing a focus on the array sequence in the vertical direction, the scan lines X, columns of pixels 3, and supply lines Z are arrayed repeatedly in this order. The scan line X and supply line Z supply signals to the sub-pixels Pr, Pg, and Pb arrayed on one row in the horizontal direction.

The circuit arrangement of the sub-pixels Pr, Pg, and Pb will be described next.

Figure 2:
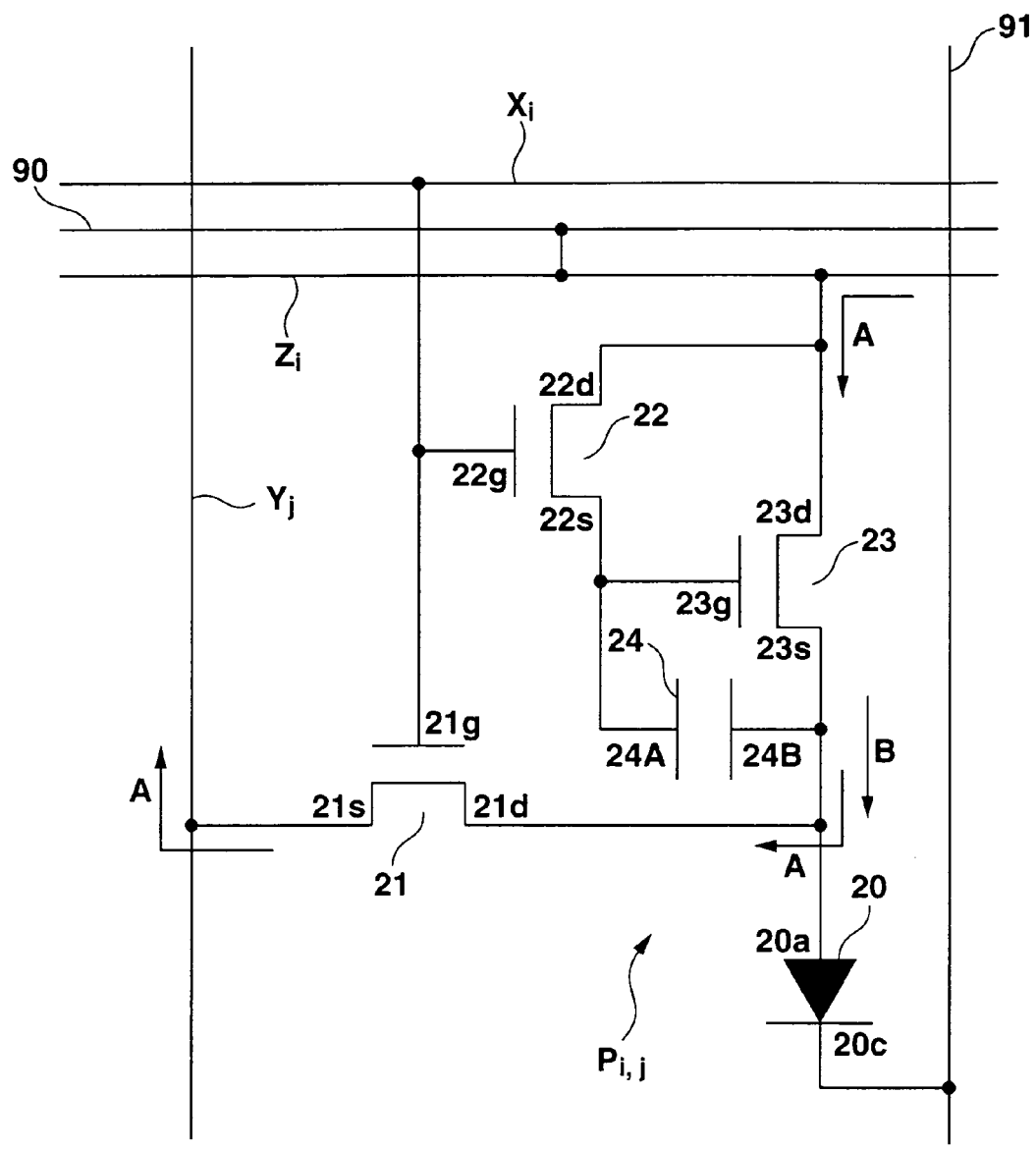
FIG. 2 is an equivalent circuit diagram of a sub-pixel.

The sub-pixels Pr, Pg, and Pb have the same structure. As shown in FIG. 2, the 1-dot sub-pixel P has an organic EL element 20, first or switch transistor 21, second or holding transistor 22, third or driving transistor 23, and capacitor 24. All the transistors are N-channel amorphous silicon thin-film transistors.

The organic EL element 20 has a sub-pixel electrode 20a serving as a pixel electrode, an organic EL layer 20b (FIG. 4), and a counter electrode 20c. The counter electrode 20c is electrically connected to a common interconnection 91.

The switch transistor 21 has a source 21s, drain 21d, and gate 21d. The source 21s is electrically connected to the signal line Y. The drain 21d is electrically connected to the sub-pixel electrode 20a of the organic EL element 20, a source 23s of the driving transistor 23, and an electrode 24B of the capacitor 24. The gate 21d is electrically connected to a gate 22g of the holding transistor 22 and the scan line X.

The holding transistor 22 has a source 22s, drain 22d, and gate 22g. The source 22s is electrically connected to a gate 23g of the driving transistor 23 and an electrode 24A of the capacitor 24. The drain 22d is electrically connected to a drain 23d of the driving transistor 23 and the supply line Z. The gate 22g is electrically connected to the gate 21g of the switch transistor 21 and the scan line X. The drain 22d of the holding transistor 22 may be connected to the scan line X instead of being electrically connected to the drain 23d of the driving transistor 23.

The driving transistor 23 has the source 23s, drain 23d, and gate 23g. The source 23s is electrically connected to the sub-pixel electrode 20a of the organic EL element 20, the drain 21d of the switch transistor 21, and the electrode 24B of the capacitor 24. The drain 23d is electrically connected to the drain 22d of the holding transistor 22 and the supply line Z. The gate 23g is electrically connected to the source 22s of the holding transistor 22 and the electrode 24A of the capacitor 24.

The capacitor 24 has the electrodes 24A and 24B formed on an insulating substrate 2 to oppose each other in the vertical direction, and a dielectric layer inserted between the electrodes 24A and 24B. The capacitors 24 of all the sub-pixels Pr, Pg, and Pb have the same layer structure.

The planar structure of the sub-pixel will be described next.

Figure 3:
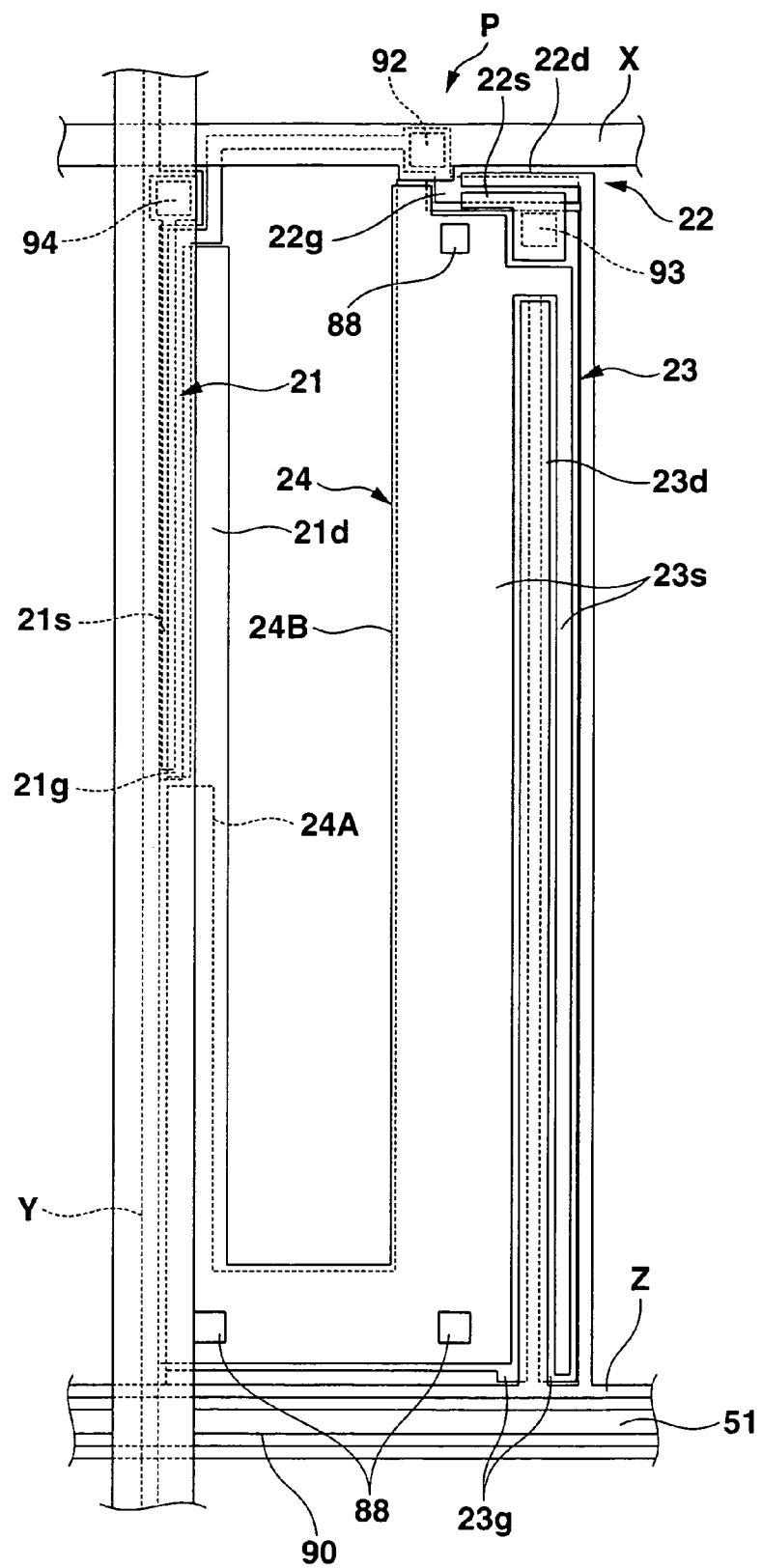
FIG. 3 is a plan view showing the electrodes of the sub-pixel.

As shown in FIG. 3, when the sub-pixels Pr, Pg, and Pb are viewed from the upper side, the switch transistor 21 is arranged along the signal line Y. The holding transistor 22 is arranged at a corner of the sub-pixel P adjacent to the scan line X. The driving transistor 23 is arranged along the adjacent signal line Y. The capacitor 24 is arranged along the driving transistor 23.

When the entire display panel 1 is viewed from the upper side, and a focus is placed on the switch transistors 21, holding transistors 22, and driving transistors 23 of the sub-pixels Pr, Pg, and Pb, the transistors 21, 22, and 23 are arrayed in a matrix.

The sub-pixel electrode 20a of the organic EL element 20 is not illustrated in FIGS. 1 and 3 for illustrative convenience of the first to third transistors 21, 22, and 23. The sub-pixel electrode 20a is arranged in a rectangular region surrounded by the signal lines Y adjacent in the horizontal direction and the supply line Z and scan line X adjacent in the vertical direction. The sub-pixel electrode 20a is formed in a rectangular shape along the rectangular region. When the entire display panel 1 is viewed from the upper side, and a focus is placed on only the sub-pixel electrodes 20a of the sub-pixels Pr, Pg, and Pb, said plurality of sub-pixel electrodes 20a are arrayed in a matrix.

The layer structure of the display panel 1 will be described next.

Figure 4:
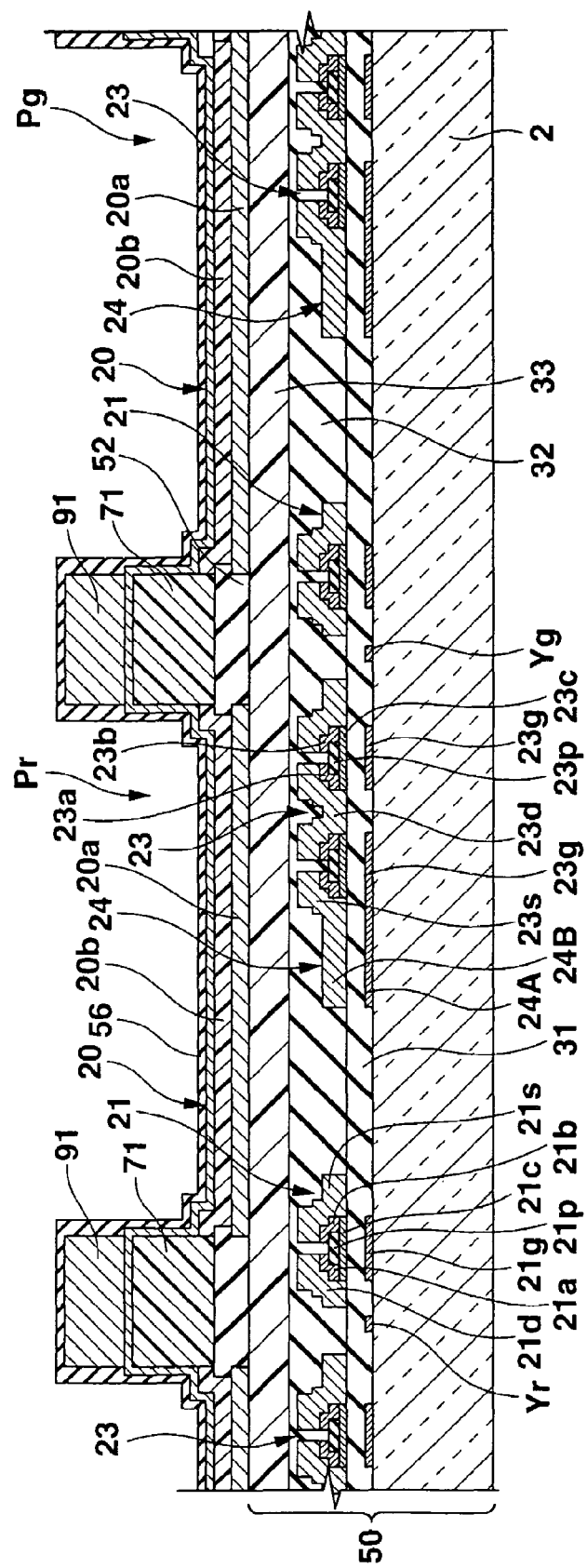
FIG. 4 is a sectional view taken along a line IV-IV in FIG. 1 in the direction of thickness of an insulating substrate.
Figure 5:
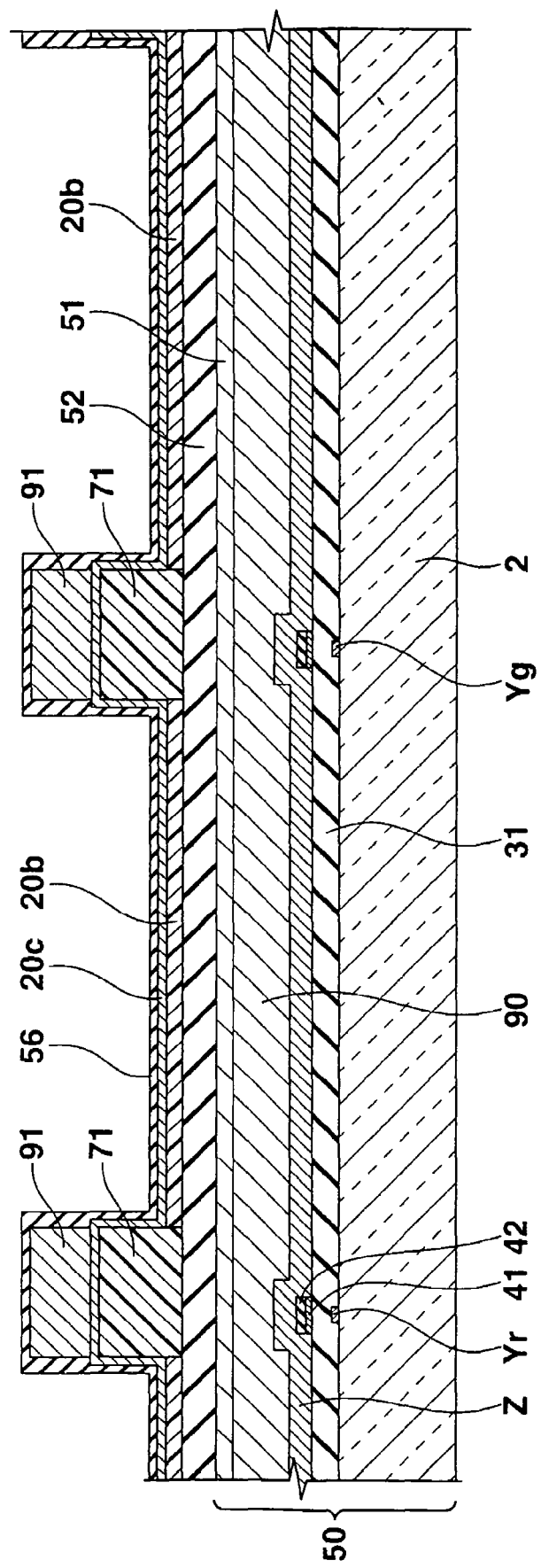
FIG. 5 is a sectional view taken along a line V-V in FIG. 1 in the direction of thickness of the insulating substrate.
Figure 6:
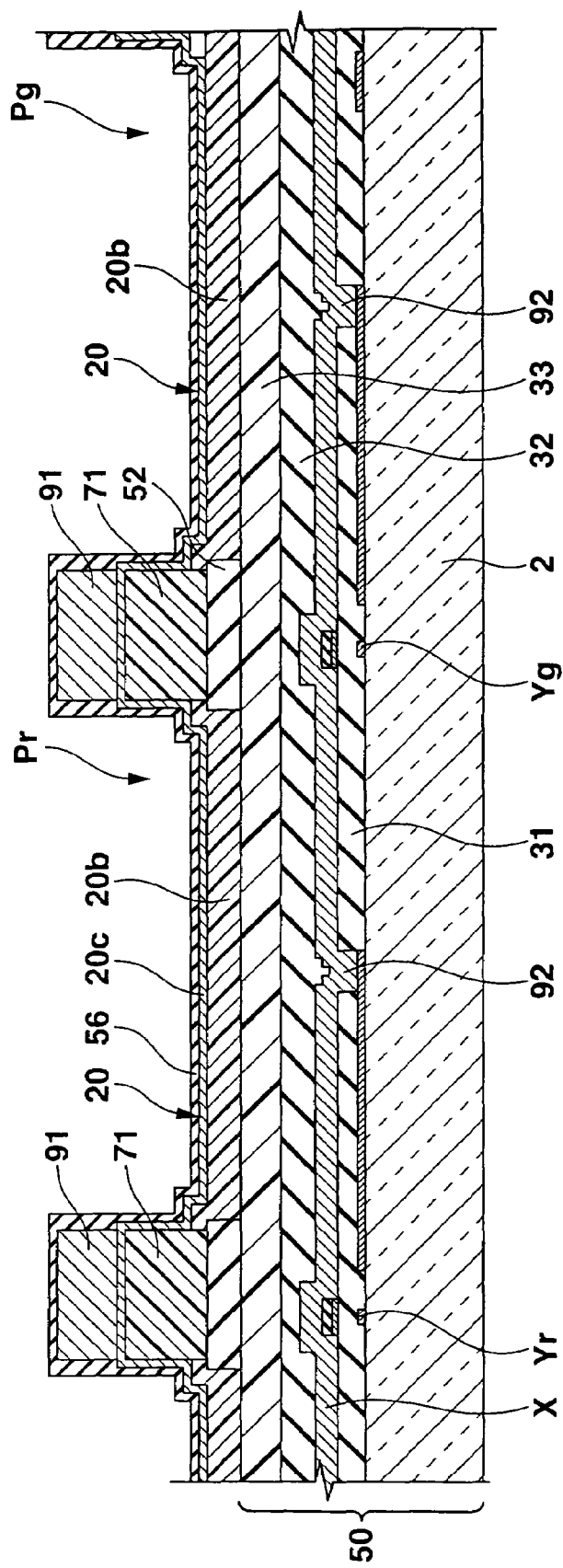
FIG. 6 is a sectional view taken along a line VI-VI in FIG. 1 in the direction of thickness of the insulating substrate.
Figure 7:
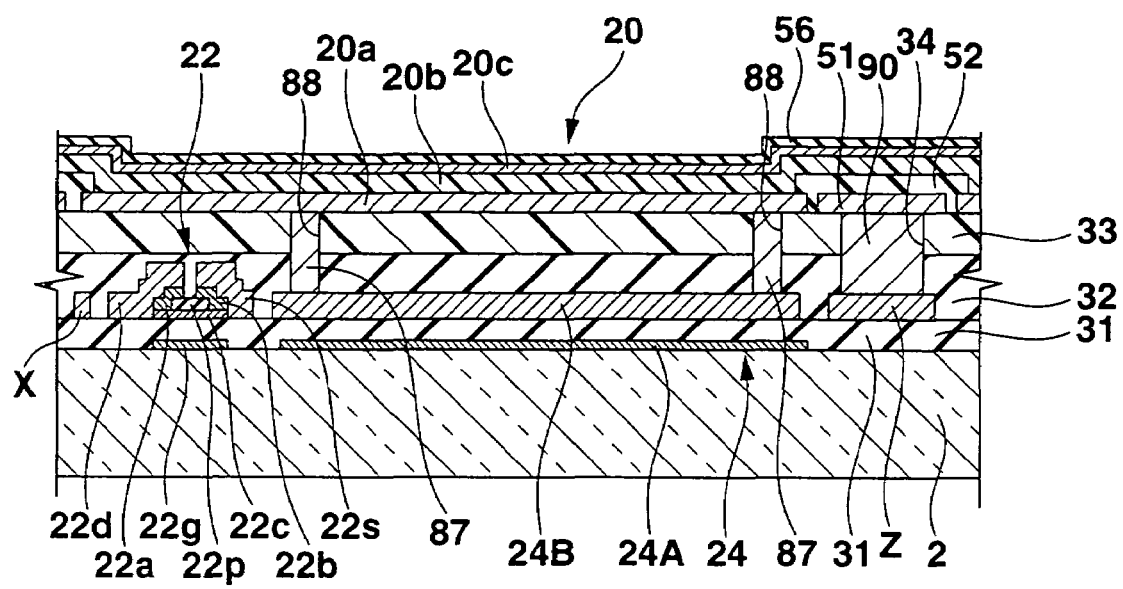
FIG. 7 is a sectional view taken along a line VII-VII in FIG. 1 in the direction of thickness of the insulating substrate.

FIG. 4 is a sectional view taken along a line IV-IV in FIG. 1 in the direction of thickness of the insulating substrate 2. FIG. 5 is a sectional view taken along a line V-V in FIG. 1 in the direction of thickness of the insulating substrate 2. FIG. 6 is a sectional view taken along a line VI-VI in FIG. 1 in the direction of thickness of the insulating substrate 2. FIG. 7 is a sectional view taken along a line VII-VII in FIG. 1 in the direction of thickness of the insulating substrate 2. As shown in FIG. 4, the display panel 1 has the insulating substrate 2 which is optically transparent and has a flexible sheet shape or a rigid plate shape. On the upper surface of the insulating substrate 2, the switch transistor 21, holding transistor 22, driving transistor 23, and capacitor 24 are formed in a layer structure.

The switch transistor 21 includes the gate 21g, gate insulating film 31, semiconductor film 21c, channel protective film 21p, impurity-doped semiconductor films 21a and 21b, drain 21d, and source 21s. The gate 21g is formed on the upper surface of the insulating substrate 2. The gate insulating film 31 is formed with its part located on the gate 21g. The semiconductor film 21c opposes the gate 21g via the part of the gate insulating film 31. The channel protective film 21p is formed on the central portion of the semiconductor film 21c. The impurity-doped semiconductor films 21a and 21b are formed on two ends of the semiconductor film 21c to be spaced apart from each other and partially overlap the channel protective film 21p. The drain 21d is formed on the impurity-doped semiconductor film 21a. The source 21s is formed on the impurity-doped semiconductor film 21b.

The drain 21d and source 21s can have either a single-layer structure or a layered structure including two or more layers.

As shown in FIG. 7, the holding transistor 22 includes the gate 22g, the gate insulating film 31, a semiconductor film 22c, a channel protective film 22p, impurity-doped semiconductor films 22a and 22b, the drain 22d, and the source 22s. The gate 22g is formed on the upper surface of the insulating substrate 2. The gate insulating film 31 has a part formed on the gate 22g. The semiconductor film 22c opposes the gate 22g via the part of the gate insulating film 31. The channel protective film 22p is formed on the central portion of the semiconductor film 22c. The impurity-doped semiconductor films 22a and 22b are formed on two ends of the semiconductor film 22c to be spaced apart from each other and partially overlap the channel protective film 22p. The drain 22d is formed on the impurity-doped semiconductor film 22a. The source 22s is formed on the impurity-doped semiconductor film 22b.

As shown in FIG. 4, the driving transistor 23 includes the gate 23g, the gate insulating film 31, a semiconductor film 23c, a channel protective film 23p, impurity-doped semiconductor films 23a and 23b, the drain 23d, and the source 23s. The gate 23g is formed on the upper surface of the insulating substrate 2. The gate insulating film 31 has a part formed on the gate 23g. The semiconductor film 23c opposes the gate 23g via the part of the gate insulating film 31. The channel protective film 23p is formed on the central portion of the semiconductor film 23c. The impurity-doped semiconductor films 23a and 23b are formed on two ends of the semiconductor film 23c to be spaced apart from each other and partially overlap the channel protective film 23p. The drain 23d is formed on the impurity-doped semiconductor film 23a. The source 23s is formed on the impurity-doped semiconductor film 23b. As shown in FIG. 3, the driving transistor 23 is formed into a U shape so that the channel width is large.

The drain 23d and source 23s can have either a single-layer structure or a layered structure including two or more layers.

The capacitor 24 has the electrode 24A, gate insulating film 31, and electrode 24B. The electrode 24A is formed on the upper surface of the insulating substrate 2. The gate insulating film 31 serving as a dielectric has a part formed on the electrode 24A. The electrode 24B opposes the electrode 24A via the part of the gate insulating film 31.

The switch transistors 21, holding transistors 22, driving transistors 23, and capacitors 24 have the same layer structures in all the sub-pixels Pr, Pg, and Pb.

The gates 21g of the switch transistors 21, the gates 22g of the holding transistors 22, the gates 23g of the driving transistors 23, the electrodes 24A of the capacitors 24, and all the signal lines Yr, Yg, and Yb are formed, using photolithography and etching, by patterning a conductive film formed on the entire upper surface of the insulating substrate 2.

The gates 21g of the switch transistors 21, the gates 22g of the holding transistors 22, the gates 23g of the driving transistors 23, the electrodes 24A of the capacitors 24, and the signal lines Yr, Yg, and Yb are formed, using photolithography and etching, by patterning a conductive film formed on the entire surface of the insulating substrate 2. The conductive film as the base of the gates 21g of the switch transistors 21, the gates 22g of the holding transistors 22, the gates 23g of the driving transistors 23, the lower electrodes 24A of the capacitors 24, and the signal lines Yr, Yg, and Yb will be referred to as a gate layer hereinafter.

The gate insulating film 31 is formed on the entire surface all over the switch transistors 21, holding transistors 22, driving transistors 23, and capacitors 24. The gate insulating film 31 covers the gates 21g of the switch transistors 21, the gates 22g of the holding transistors 22, the gates 23g of the driving transistors 23, the electrodes 24A of the capacitors 24, and the signal lines Yr, Yg, and Yb.

The drains 21d and sources 21s of the switch transistors 21, the drains 22d and sources 22s of the holding transistors 22, the drains 23d and sources 23s of the driving transistors 23, the electrodes 24B of the capacitors 24, and all the scan lines X and supply lines Z are formed, using photolithography and etching, by patterning a conductive film formed on the entire upper surface of the gate insulating film 31.

The conductive film as the base of the drains 21d and sources 21s of the switch transistors 21, the drains 22d and sources 22s of the holding transistors 22, the drains 23d and sources 23s of the driving transistors 23, the electrodes 24B of the capacitors 24, the scan lines X, and the supply lines Z will be referred to as a drain layer hereinafter.

As shown in FIG. 3, a contact hole 92 is formed for each 1-dot sub-pixel P in the gate insulating film 31 at a portion overlapping the scan line X when viewed from the upper side. The gate 21g of the switch transistor 21 and the gate 22g of the holding transistor 22 are electrically connected to the scan line X through the contact hole 92.

A contact hole 94 is formed for each 1-dot sub-pixel P in the gate insulating film 31 at a portion overlapping the signal line Y when viewed from the upper side. The source 21s of the switch transistor 21 is electrically connected to the signal line Y through the contact hole 94.

A contact hole 93 is formed for each 1-dot sub-pixel P in the gate insulating film 31 at a portion overlapping the electrode 24A. The source 22s of the holding transistor 22 is electrically connected to the gate 23g of the driving transistor 23 and the electrode 24A of the capacitor 24 through the contact hole 93.

First and second protective films 41 and 42 are formed on parts of the gate insulating film 31 on the signal lines Yr, Yg, and Yb as shown in FIG. 5. The first protective film 41 is formed by patterning the same layer as the semiconductor film 23c through the gate insulating film 31. The second protective film 42 is formed by patterning the same layer as the channel protective film 23p. Both protective films 41 and 42 prevent the signal lines Yr, Yg, and Yb from being short-circuited to any one of the supply lines Z through a pinhole or pinholes formed in the gate insulating film 31.

The switch transistors 21, holding transistors 22, driving transistors 23, scan lines X, and supply lines Z are covered with a transistor protective insulating film 32 formed on the entire surface.

The transistor protective insulating film 32 is divided into rectangles at portions overlapping the supply lines Z when viewed from the upper side. This will be described later in detail.

A planarization film 33 is formed on the upper surface of the transistor protective insulating film 32 by hardening a resin so that the three-dimensional pattern of the switch transistors 21, holding transistors 22, driving transistors 23, scan lines X, and supply lines Z is eliminated.

To use the display panel 1 of this embodiment as a bottom emission type, i.e., to use the surface of the insulating substrate 2, where the first to third transistors 21, 22, and 23 are arranged, as the display screen, transparent materials are used for the gate insulating film 31, transistor protective insulating film 32, and planarization film 33.

The layered structure from the insulating substrate 2 to the planarization film 33 is called a transistor array substrate 50.

Trenches 34 long in the horizontal direction are formed in the transistor protective insulating film 32 and planarization film 33 at portions overlapping the supply lines Z when viewed from the upper side as shown in FIG. 7. The transistor protective insulating film 32 and planarization film 33 are divided into rectangles by the trenches 34. The feed interconnections 90 are buried in the trenches 34 so that the feed interconnections 90 are directly formed on the supply lines Z in the trenches 34.

The feed interconnections 90 are conductive layers formed, after the trenches 34 are formed in the transistor protective insulating film 32 and planarization film 33, by electroplating by using the supply lines Z exposed from the trenches 34 as a lower electrode. The feed interconnections 90 are thicker than the signal lines Yr, Yg, and Yb, scan lines X, and supply lines Z. The total thickness of the feed interconnection 90 and the supply line Z almost equals the total thickness of the transistor protective insulating film 32 and planarization film 33. The upper surface of the planarization film 33 is almost flush with the upper surface of the feed interconnection 90. The feed interconnections 90 preferably made of at least one of copper, aluminum, gold, and nickel.

The plurality of sub-pixel electrodes 20a are arrayed in a matrix on the surface of the planarization film 33, i.e., the upper surface of the transistor array substrate 50. The sub-pixel electrode 20a is an electrode functioning as the anode of the organic EL element 20. Hence, the sub-pixel electrode 20a preferably has a relatively high work function so that holes can efficiently be injected in the organic EL layer 20b.

In a bottom emission structure, the sub-pixel electrode 20a is transparent to visible light. A material containing, e.g., indium tin oxide (ITO), indium zinc oxide, indium oxide ($In_2O_3$), tin oxide ($SnO_2$), zinc oxide (ZnO), or cadmium tin oxide (CTO) as the major component can be used.

To use the display panel 1 of this embodiment as a top emission type, i.e., to use the opposite side of the surface of the insulating substrate 2, where the first to third transistors 21, 22, and 23 are arranged, as the display screen, a reflecting film having high conductivity and high visible light reflectance is preferably formed between the sub-pixel electrode 20a and the planarization film 33. Alternatively, the sub-pixel electrode 20a itself is preferably formed as a reflecting electrode.

Three contact holes 88 are formed for each 1-dot sub-pixel P in the planarization film 33 and transistor protective insulating film 32 at portions overlapping the sub-pixel electrode 20a. Conductive pads 87 are buried in the contact holes 88. With this structure, the sub-pixel electrode 20a is electrically connected to the electrode 24B of the capacitor 24, the drain 21d of the switch transistor 21, and the source 23s of the driving transistor 23 through the contact holes 88. The conductive pads 87 are preferably formed together with the feed interconnections 90 by electroplating especially by using the upper electrodes 24B as a lower electrode.

The sub-pixel electrodes 20a are formed, using photolithography and etching, by patterning a conductive film formed on the entire upper surface of the planarization film 33. By patterning the conductive film, conductive lines 51 are formed on the feed interconnections 90 together with the sub-pixel electrodes 20a. The conductive lines 51 are formed along the running direction of the feed interconnections 90, as shown in FIG. 3.

A mesh-shaped insulating film 52 is patterned between the adjacent sub-pixel electrodes 20a to surround each sub-pixel electrode 20a when viewed from the upper side. When viewed from the upper side, the sub-pixel electrodes 20a are surrounded by the insulating film 52. The insulating film 52 also covers the conductive lines 51. The insulating film 52 covers the edges of the sub-pixel electrodes 20a.

A bank 71 which is made of a photosensitive insulating resin such as polyimide and is thicker than the sub-pixel electrode 20a is formed by lithography on each vertically running portion of the insulating film 52 having a lattice shape in the horizontal and vertical directions. That is, the bank 71 is a ridge running in the vertical direction. When viewed from the upper side, the banks 71 overlap the signal lines Yr, Yg, and Yb. More specifically, the banks 71 are arranged between a column of the plurality of red sub-pixels Pr arrayed in the vertical direction and a column of the plurality of green sub-pixels Pg arrayed in the vertical direction and arranged adjacent to the column of the red sub-pixels Pr in the horizontal direction, between a column of the green sub-pixels Pg and a column of the plurality of blue sub-pixels Pb arranged adjacent to the column of the green sub-pixels Pg in the horizontal direction, and between a column of the blue sub-pixels Pb and a column of the plurality of red sub-pixels Pb arranged adjacent to the column of the blue sub-pixels Pb in the horizontal direction.

The organic EL layer 20b is formed on the sub-pixel electrode 20a. The organic EL layer 20b is a light-emitting layer of broad sense. The organic EL layer 20b is made of a light-emitting material as an organic compound. The organic EL layer 20b has a two-layer structure in which a hole transport layer and a light-emitting layer of narrow sense are formed sequentially from the sub-pixel electrode 20a. The hole transport layer is made of PEDOT (polythiophene) as a conductive polymer and PSS (polystyrene sulfonate) as a dopant. The light-emitting layer of narrow sense is made of a polyfluorene-based light-emitting material. In the red sub-pixel Pr, the organic EL layer 20b emits red light. In the green sub-pixel Pg, the organic EL layer 20b emits green light. In the blue sub-pixel Pb, the organic EL layer 20b emits blue light.

The organic EL layers 20b are formed into a band shape long in the vertical direction to cover the plurality of sub-pixel electrodes 20a arrayed in a line in the sub-pixels Pr, Pg, and Pb.

The organic EL layer 20b is independently provided for each sub-pixel electrode 20a. When viewed from the upper side, the plurality of organic EL layers 20b may be arrayed in a matrix.

The organic EL layer 20b is formed by wet coating such as an ink-jet method after the bank 71 is formed. To form the organic EL layer 20b, an organic compound-containing solution is applied onto the sub-pixel electrode 20a. Since the bank 71 projecting from the surface of the transistor array substrate 50 is formed between the sub-pixel electrodes 20a adjacent in the horizontal direction, the organic compound-containing solution applied onto a sub-pixel electrode 20a never leaks to the adjacent pixel electrodes 20a.

The organic EL layer 20b need not always have the above-described two-layer structure. A three-layer structure including a hole transport layer, a light-emitting layer of narrow sense, and an electron transport layer formed sequentially from the sub-pixel electrode 20a may be employed. A single-layer structure including a light-emitting layer of narrow sense also may be used. A layered structure having an electron or hole injection layer inserted between appropriate layers in one of the above layer structures may be employed. Any other layered structures can also be used.

The counter electrode 20c functioning as the cathode of the organic EL element 20 is formed on the organic EL layer 20b. The counter electrode 20c is a common electrode commonly formed for the sub-pixels Pr, Pg, and Pb. The counter electrode 20c is formed on the entire surface and also covers the banks 71.

The counter electrode 20c is preferably formed from a material having a work function lower than the sub-pixel electrode 20a, and for example, a single substance or an alloy containing at least one of magnesium, calcium, lithium, barium, indium, and a rare earth metal. The counter electrode 20c may have a layered structure in which the layers of various kinds of materials described above are stacked, or a layered structure in which a metal layer hard to oxidize is deposited in addition to the layers of various kinds of materials described above to lower the sheet resistance. More specifically, a layered structure including a highly pure barium layer having a low work function and provided on the interface side contacting the organic EL layer 20b, and an aluminum layer provided to cover the barium layer, or a layered structure including a lithium layer on the lower side and an aluminum layer on the upper side can be used. In a top emission structure, the counter electrode 20c may be a transparent electrode having the above-described thin film with a low work function and a transparent conductive film made of, e.g., ITO on the thin film.

Figure 8:
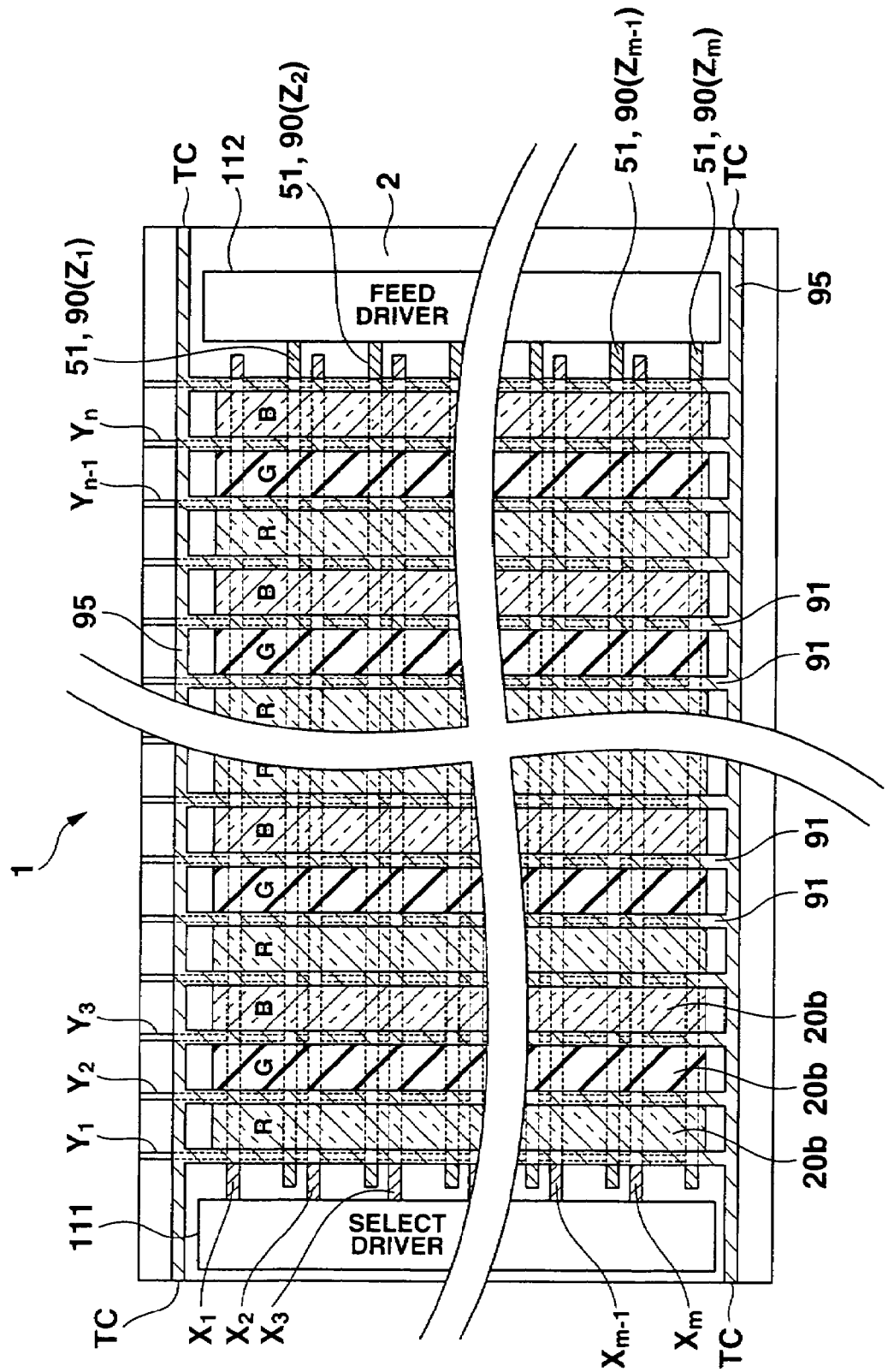
FIG. 8 is a schematic plan view showing the interconnection structure of a display panel.
Figure 10:
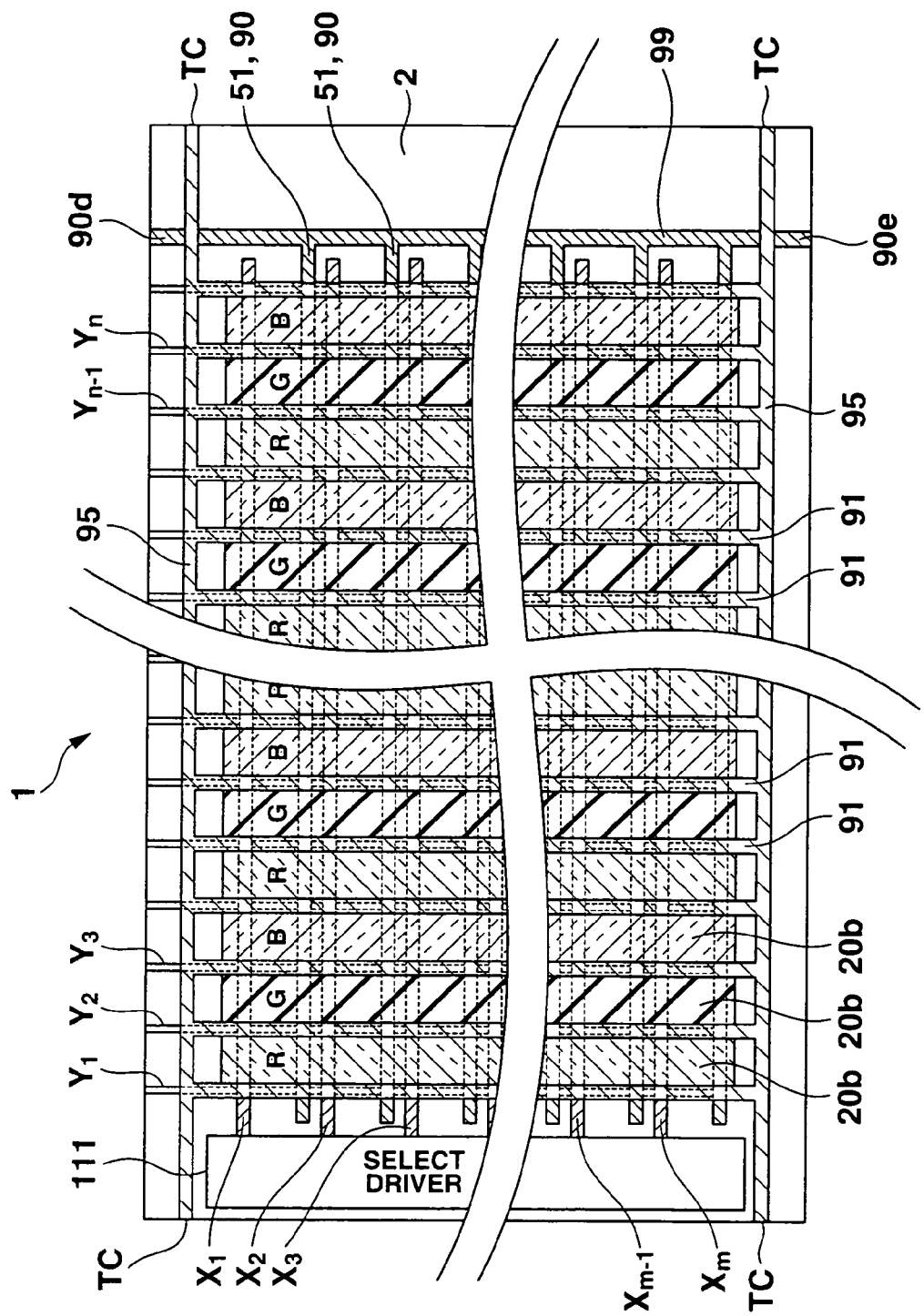
FIG. 10 is a schematic plan view showing the interconnection structure of the display panel.

The common interconnections 91 are formed on parts of the upper surface of the counter electrode 20c above the banks 71 to reduce the sheet resistance of the upper electrode of the organic EL elements 20. When viewed from the upper side, the common interconnections 91 overlap the bank 71 provided along the column direction. Since the common interconnections 91 and counter electrode 20c are in contact with each other, the counter electrode 20c is electrically connected to the common interconnections 91, as shown in FIG. 2. The common interconnections 91 are formed by electroplating and are thicker than the counter electrode 20c or the electrodes of the switch transistors 21, holding transistors 22, and driving transistors 23. The common interconnections 91 are electrically connected with each other by lead interconnections 95 which run in the horizontal direction in the non-pixel region outside the pixel region, as shown in FIGS. 8 and 10. The lead interconnections 95 are electrically connected to a plurality of terminal portions Tc on the peripheral portion of the insulating substrate 2. The common interconnections 91 and counter electrode 20c are set to an equipotential by a voltage Vcom applied from an external circuit to the terminal portions Tc. The common interconnections 91 preferably made of at least one of copper, aluminum, gold, and nickel and are so thick that they are opaque to light emitted from the organic EL layers 20b.

Figure 12:
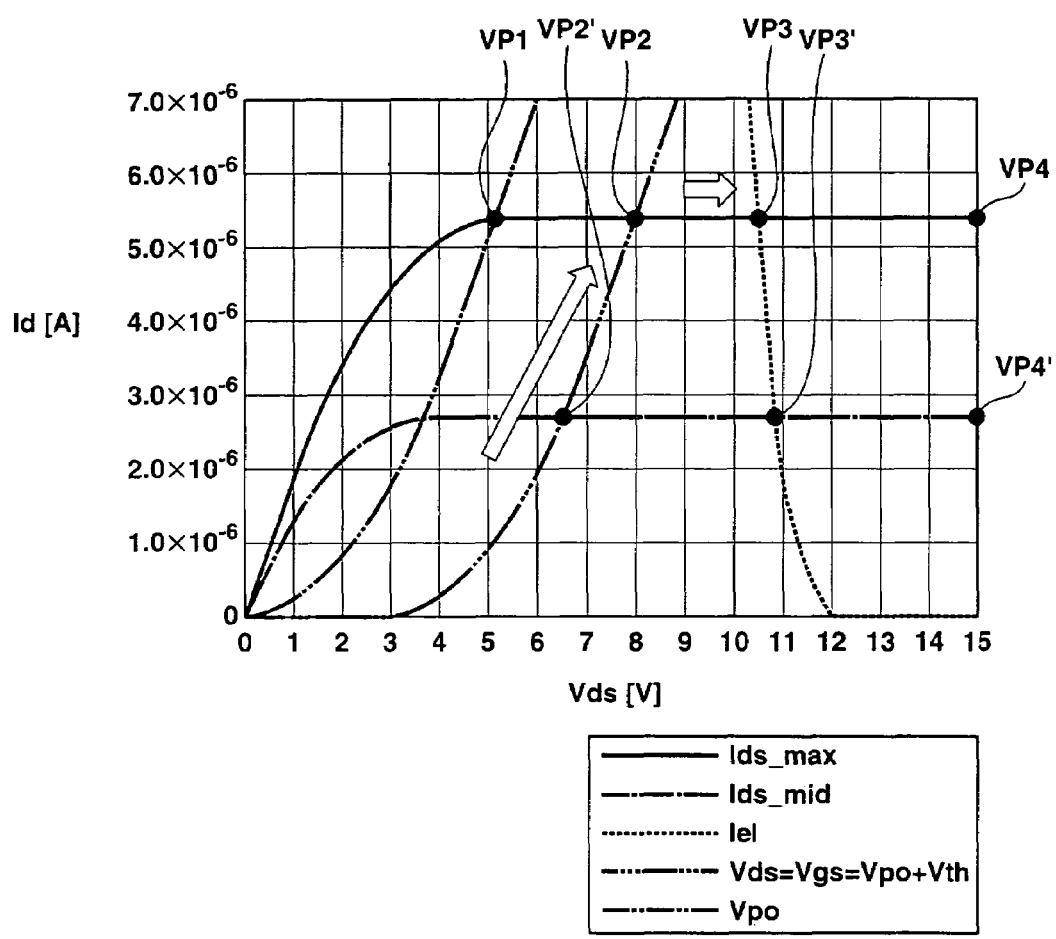
FIG. 12 is a graph showing the current vs. voltage characteristic of the driving transistor and organic EL element in the sub-pixel.

When the EL display panel 1 has pixels corresponding to WXGA (768×1366), the desired width and sectional area of the feed interconnection 90 and common interconnection 91 are defined. FIG. 12 is a graph showing the current vs. voltage characteristic of the driving transistor 23 and organic EL element 20 of each sub-pixel P.

Referring to FIG. 12, the ordinate represents the current value of the write current Id flowing between the drain 23d and source 23s of one driving transistor 23 or the current value of the driving current flowing between the anode and cathode of one organic EL element 20. The abscissa represents the voltage Vds between the drain 23d and source 23s of one driving transistor 23 (also the voltage between the gate 23g and drain 23d of one driving transistor 23). Referring to FIG. 12, a solid line Ids max indicates a write current and driving current for the highest luminance gray level (brightest display). A one-dot dashed line Ids mid indicates a write current and driving current for an intermediate highest luminance gray level between the highest luminance gray level and the lowest luminance gray level. A two-dots dashed line Vpo indicates a threshold value between the unsaturation region (linear region) and the saturation region of the driving transistor 23, i.e., the pinch-off voltage. A three-dots dashed line Vds indicates a write current flowing between the drain 23d and source 23s of the driving transistor 23. A dot line Iel indicates a driving current flowing between the anode and cathode of the organic EL element 20.

A voltage VP1 is the pinch-off voltage of the driving transistor 23 for the highest luminance gray level. A voltage VP2 is the drain-to-source voltage of the driving transistor 23 when a write current for the highest luminance gray level flows. A voltage VELmax (voltage VP4−voltage VP3) is the anode-to-cathode voltage when the organic EL element 20 emits light by a driving current of the highest luminance gray level, which has a current value equal to that of the write current for the highest luminance gray level. A voltage VP2' is the drain-to-source voltage of the driving transistor 23 when a write current for the intermediate luminance gray level flows. A voltage (voltage VP4'−voltage VP3') is the anode-to-cathode voltage when the organic EL element 20 emits light by a driving current of the intermediate luminance gray level, which has a current value equal to that of the write current for the intermediate luminance gray level.

To drive the driving transistor 23 and organic EL element 20 in the saturation region, a value VX obtained by subtracting (the voltage Vcom of the common interconnection 91 during the light emission period) from (the driving feed voltage VH of the feed interconnection 90 during the light emission period) satisfies $$VX = Vpo + Vth + Vm + VEL \quad (1)$$

where Vth (=VP2−VP1 for the highest luminance) is the threshold voltage of the driving transistor 23, VEL (=VEmax for the highest luminance) is the anode-to-cathode voltage of the organic EL element 20, and Vm is an allowable voltage which displaces in accordance with the gray level.

As is apparent from FIG. 12, of the voltage VX, the higher the luminance gray level is, the higher the voltage (Vpo+Vth) necessary between the drain and source of the transistor 23 is, and also, the higher the voltage VEL necessary between the anode and cathode of the organic EL element 20 is. Hence, the allowable voltage Vm becomes low as the luminance gray level becomes high. A minimum allowable voltage Vmmin is VP3−VP2.

The organic EL element 20 generally degrades and increases its resistance over time no matter whether a low or high molecular weight EL material. It has been confirmed that the anode-to-cathode voltage after 10,000 hrs is about 1.4 times that in the initial state. That is, the voltage VEL rises along with the elapse of time even when the luminance gray level does not change. The operation is stable for a long time when the allowable voltage Vm in the initial driving state is as high as possible. Hence, the voltage VX is set such that the voltage VEL becomes 8V or more and, more preferably, 13V or more.

The allowable voltage Vm includes not only the increase amount of the resistance of the organic EL element 20 but also the voltage drop by the feed interconnection 90.

If the voltage drop is large because of the influence of the interconnection resistance of the feed interconnection 90, the power consumption of the EL display panel 1 considerably increases. Hence, the voltage drop of the feed interconnection 90 is especially preferably set to 1V or less.

A pixel width Wp as the row-direction length of one pixel, the number of pixels (1366) in the row direction, the extension portion from the first lead interconnection to one interconnection terminal outside the pixel region, and the extension portion from the first lead interconnection to the other interconnection terminal outside the pixel region are taken into consideration. In this case, the total length of the first lead interconnection is 706.7 mm for the EL display panel 1 with a panel size of 32 inches and 895.2 mm for 40 inches. If a line width WL of the feed interconnection 90 and common interconnection 91 is large, the area of the organic EL layer 20b decreases structurally. In addition, the overlap parasitic capacitance to other interconnections is also generated, and the voltage drop becomes larger. To prevent this, the line width WL of the feed interconnection 90 and common interconnection 91 is preferably suppressed to ⅕ or less the pixel width Wp. In consideration of this, the line width WL is 34 μm or less for the EL display panel 1 with a panel size of 32 inches and 44 μm or less for 40 inches. A maximum thickness Hmax of the feed interconnection 90 and common interconnection 91 is 1.5 times the minimum process size (4 μm) of the transistors 21 to 23, i.e., 6 μm when the aspect ratio is taken into consideration. A maximum sectional area Smax of the feed interconnection 90 and common interconnection 91 is 204 μm² for 32 inches and 264 μm² for 40 inches.

Figure 13:
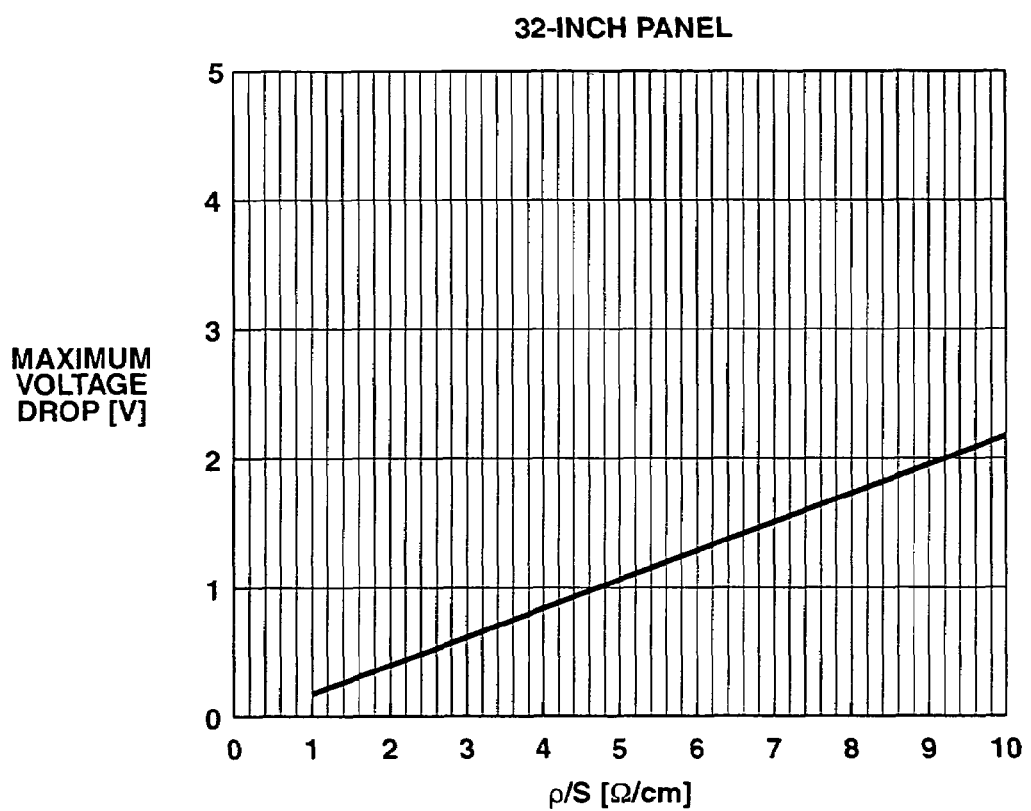
FIG. 13 is a graph showing the correlation between the maximum voltage drop and the interconnection resistivity ρ/sectional area S of a feed interconnection and common interconnection of a 32-inch EL display panel.
Figure 14:
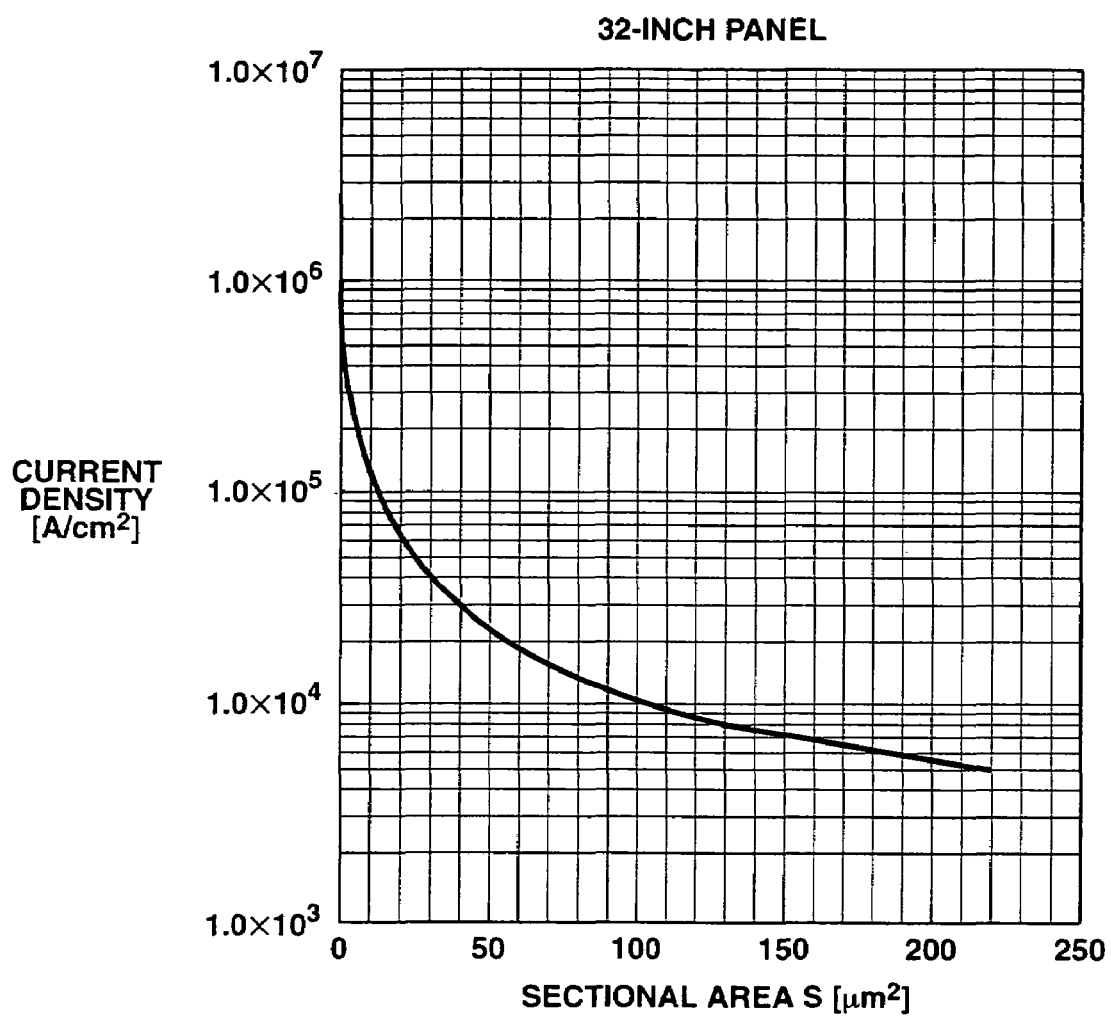
FIG. 14 is a graph showing the correlation between the sectional area and the current density of the feed interconnection and common interconnection of the 32-inch EL display panel.

To make the maximum voltage drop of the feed interconnection 90 and common interconnection 91 1V or less when the 32-inch EL display panel 1 is fully lighted to flow the maximum current, an interconnection resistivity ρ/sectional area S of the feed interconnection 90 and common interconnection 91 must be set to 4.7 Ω/cm or less, as shown in FIG. 13. FIG. 14 shows the correlation between the sectional area and the current density of the feed interconnection and common interconnection of the 32-inch EL display panel 1. The resistivity allowed when the above-described feed interconnection 90 and common interconnection 91 have the maximum sectional area Smax is 9.6 μΩcm for 32 inches and 6.4 μΩcm for 40 inches.

Figure 15:
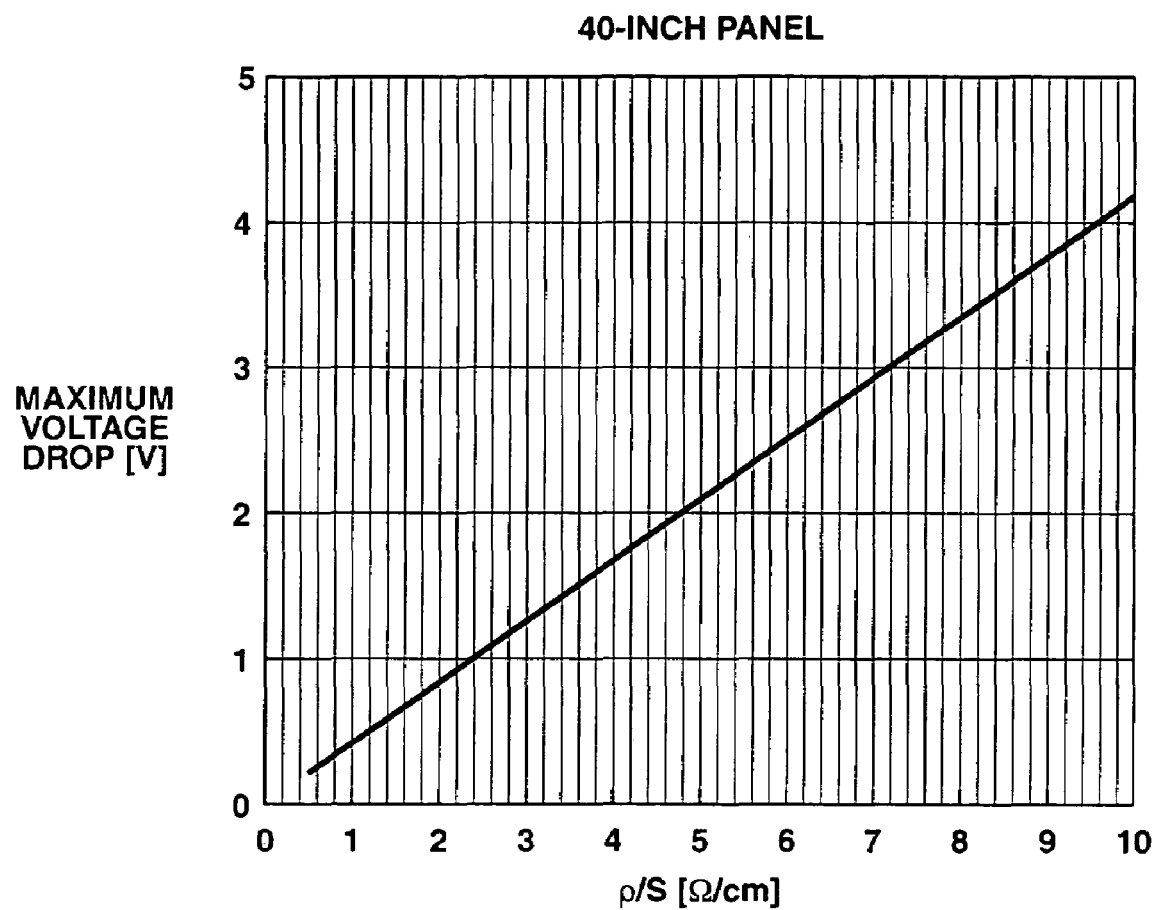
FIG. 15 is a graph showing the correlation between the maximum voltage drop and the interconnection resistivity ρ/sectional area S of the feed interconnection and common interconnection of a 40-inch EL display panel.
Figure 16:
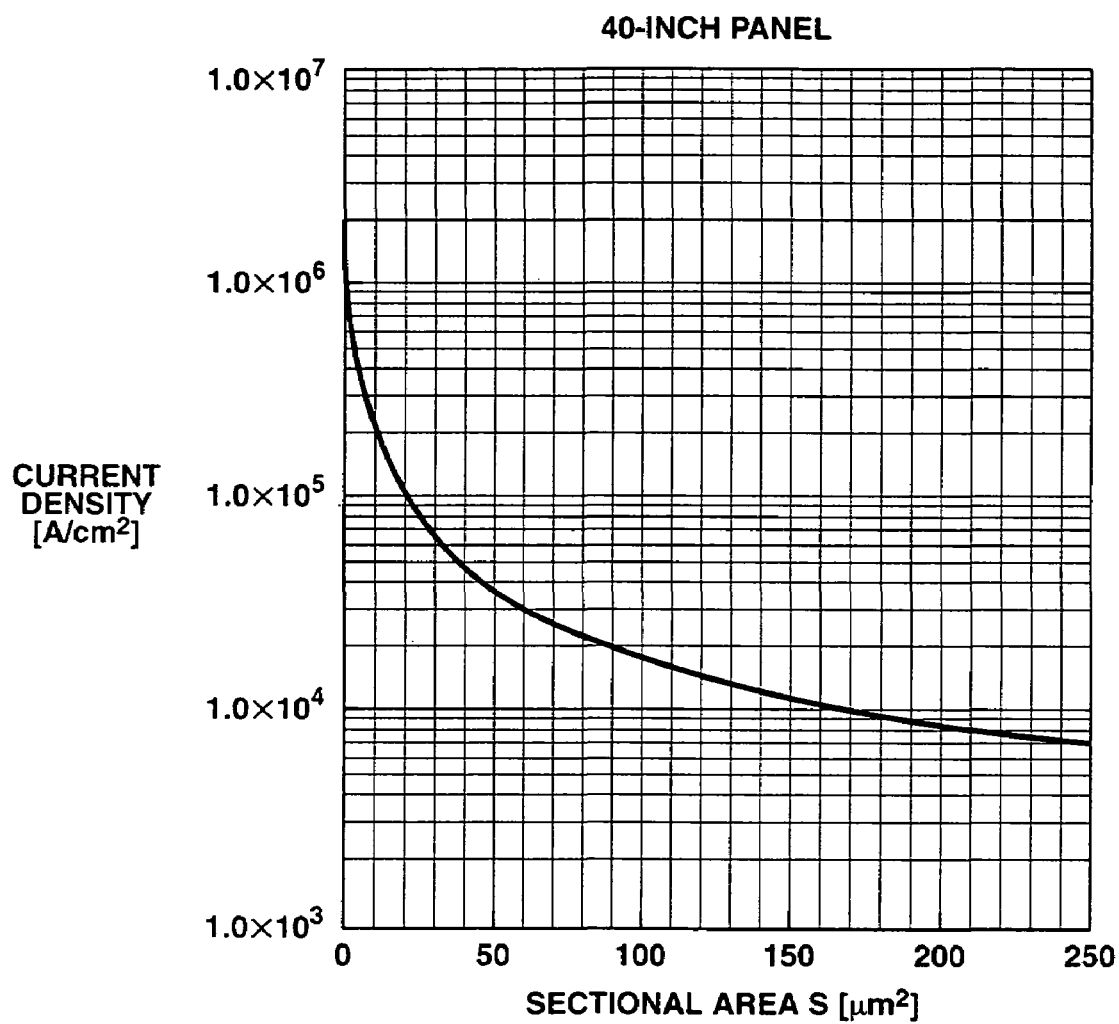
FIG. 16 is a graph showing the correlation between the sectional area and the current density of the feed interconnection and common interconnection of the 40-inch EL display panel.

To make the maximum voltage drop of the feed interconnection 90 and common interconnection 91 1V or less when the 40-inch EL display panel 1 is fully lighted to flow the maximum current, the interconnection resistivity ρ/sectional area S of the feed interconnection 90 and common interconnection 91 must be set to 2.4 Ω/cm or less, as shown in FIG. 15. FIG. 16 shows the correlation between the sectional area and the current density of the feed interconnection and common interconnection of the 40-inch EL display panel 1.

A median time to failure MTF at which the EL display panel stops operation due to a failure in the feed interconnection 90 and common interconnection 91 satisfies $$MTF = A \exp(Ea/K_b T)/\rho J^2 \quad (2)$$

where Ea is an activation energy, $K_b T = 8.617 \times 10^{-5}$ eV, ρ is the resistivity of the feed interconnection 90 and common interconnection 91, and J is a current density.

The median time to failure MTF of the feed interconnection 90 and common interconnection 91 is determined by an increase in resistivity or electromigration. When the feed interconnection 90 and common interconnection 91 are set to an Al-based material (Al single substance or an alloy such as AlTi or AlNd), and calculation is done on trial for MTF of 10,000 hrs and an operation temperature of 85° C., the current density J must be $2.1 \times 10^4$ A/cm² or less. When the feed interconnection 90 and common interconnection 91 are set to Cu, the current density J must be $2.8 \times 10^6$ A/cm² or less. It is assumed that materials except Al in an Al alloy have a resistivity lower than Al.

In consideration of these, in the 32-inch EL display panel 1, the sectional area S of the Al-based feed interconnection 90 and common interconnection 91 must be 57 μm² or more to prevent any failure in them in the full lighting state for 10,000 hrs, as shown in FIG. 14. The sectional area S of the feed interconnection 90 and common interconnection 91 made of Cu must be 0.43 μm² or more, as shown in FIG. 14.

In the 40-inch EL display panel 1, the sectional area S of the Al-based feed interconnection 90 and common interconnection 91 must be 92 μm² or more to prevent any failure in them in the full lighting state for 10,000 hrs, as shown in FIG. 16. The sectional area S of the feed interconnection 90 and common interconnection 91 made of Cu must be 0.69 μm² or more, as shown in FIG. 16.

In the 32-inch EL display panel 1, the interconnection resistivity ρ/sectional area S of the Al-based feed interconnection 90 and common interconnection 91 is 4.7 Ω/cm or less, as described above, assuming that the resistivity of the Al-based material is 4.00 μΩcm. Hence, a minimum sectional area Smin is 85.1 μm². Since the line width WL of the feed interconnection 90 and common interconnection 91 is 34 μm or less, as described above, a minimum thickness Hmin of the feed interconnection 90 and common interconnection 91 is 2.50 μm.

In the 40-inch EL display panel 1, the interconnection resistivity ρ/sectional area S of the Al-based feed interconnection 90 and common interconnection 91 is 2.4 Ω/cm or less, as described above. Hence, the minimum sectional area Smin is 167 µm². Since the line width WL of the feed interconnection 90 and common interconnection 91 is 44 µm or less, as described above, the minimum thickness Hmin of the feed interconnection 90 and common interconnection 91 is 3.80 µm.

In the 32-inch EL display panel 1, the interconnection resistivity ρ/sectional area S of the feed interconnection 90 and common interconnection 91 made of Cu is 4.7 Ω/cm or less, as described above, assuming that the resistivity of Cu is 2.10 µΩcm. Hence, the minimum sectional area Smin is 44.7 µm². Since the line width WL of the feed interconnection 90 and common interconnection 91 is 34 µm or less, as described above, the minimum thickness Hmin of the feed interconnection 90 and common interconnection 91 is 1.31 µm.

In the 40-inch EL display panel 1, the interconnection resistivity ρ/sectional area S of the feed interconnection 90 and common interconnection 91 made of Cu is 2.4 Ω/cm or less, as described above. Hence, the minimum sectional area Smin is 87.5 µm². Since the line width WL of the feed interconnection 90 and common interconnection 91 is 44 µm or less, as described above, the minimum thickness Hmin of the feed interconnection 90 and common interconnection 91 is 1.99 µm.

Hence, to cause the EL display panel 1 to operate normally at a low power consumption, the voltage drop in the feed interconnection 90 and common interconnection 91 is preferably set to 1V or less. To set such a condition, in a 32-inch panel in which the feed interconnection 90 and common interconnection 91 are made of an Al-based material, a thickness H is 2.5 to 6.0 µm, the width WL is 14.1 to 34.0 µm, and the resistivity is 4.0 to 9.6 µΩcm. In a 40-inch panel in which the feed interconnection 90 and common interconnection 91 are made of an Al-based material, the thickness H is 3.8 to 6.0 µm, the width WL is 27.8 to 44.0 µm, and the resistivity is 4.0 to 9.6 µΩcm.

In general, for the Al-based feed interconnection 90 and common interconnection 91, the thickness H is 2.5 to 6.0 µm, the width WL is 14.1 to 44.0 µm, and the resistivity is 4.0 to 9.6 µΩcm.

In a 32-inch panel in which the feed interconnection 90 and common interconnection 91 are made of Cu, the thickness H is 1.31 to 6.00 µm, the width WL is 7.45 to 34.0 µm, and the resistivity is 2.1 to 9.6 µΩcm. In a 40-inch panel in which the feed interconnection 90 and common interconnection 91 are made of Cu, the thickness H is 1.99 to 6.00 µm, the width WL is 14.6 to 44.0 µm, and the resistivity is 2.1 to 9.6 µΩcm.

In general, for the feed interconnection 90 and common interconnection 91 made of Cu, the thickness H is 1.31 to 6.00 µm, the width WL is 7.45 to 44.00 µm, and the resistivity is 2.1 to 9.6 µΩcm.

Hence, when an Al-based material or Cu is used for the feed interconnection 90 and common interconnection 91, the feed interconnection 90 and common interconnection 91 of the EL display panel 1 have the thickness H of 1.31 to 6.00 µm, the width WL of 7.45 to 44.00 µm, and the resistivity of 2.1 to 9.6 µΩcm.

A sealing protective insulating film 56 is formed on the upper surface of the counter electrode 20c. The sealing protective insulating film 56 covers the entire counter electrode 20c and common interconnections 91 to prevent any degradation in common interconnections 91 and counter electrode 20c.

When the display panel 1 of this embodiment is to be used as a top emission type, the visible light transparency of the counter electrode 20c and sealing protective insulating film 56 can be increased by forming them as thin films or by using transparent materials.

The driving method of the EL display panel 1 having the above-described arrangement will be described.

The driving method of the EL display panel 1 is roughly classified into a passive matrix driving method and an active matrix driving method. In this embodiment, two kinds of active matrix driving method will be described.

In the structure of the first display panel 1, as shown in FIG. 8, a select driver 111 connected to the scan lines $X_1$ to $X_m$ is arranged in the first peripheral portion of the insulating substrate 2. A feed driver 112 connected to the feed interconnections 90 (supply lines $Z_1$ to $Z_m$) electrically insulated from each other is arranged in the second peripheral portion of the insulating substrate 2 opposing the first peripheral portion.

Figure 9:
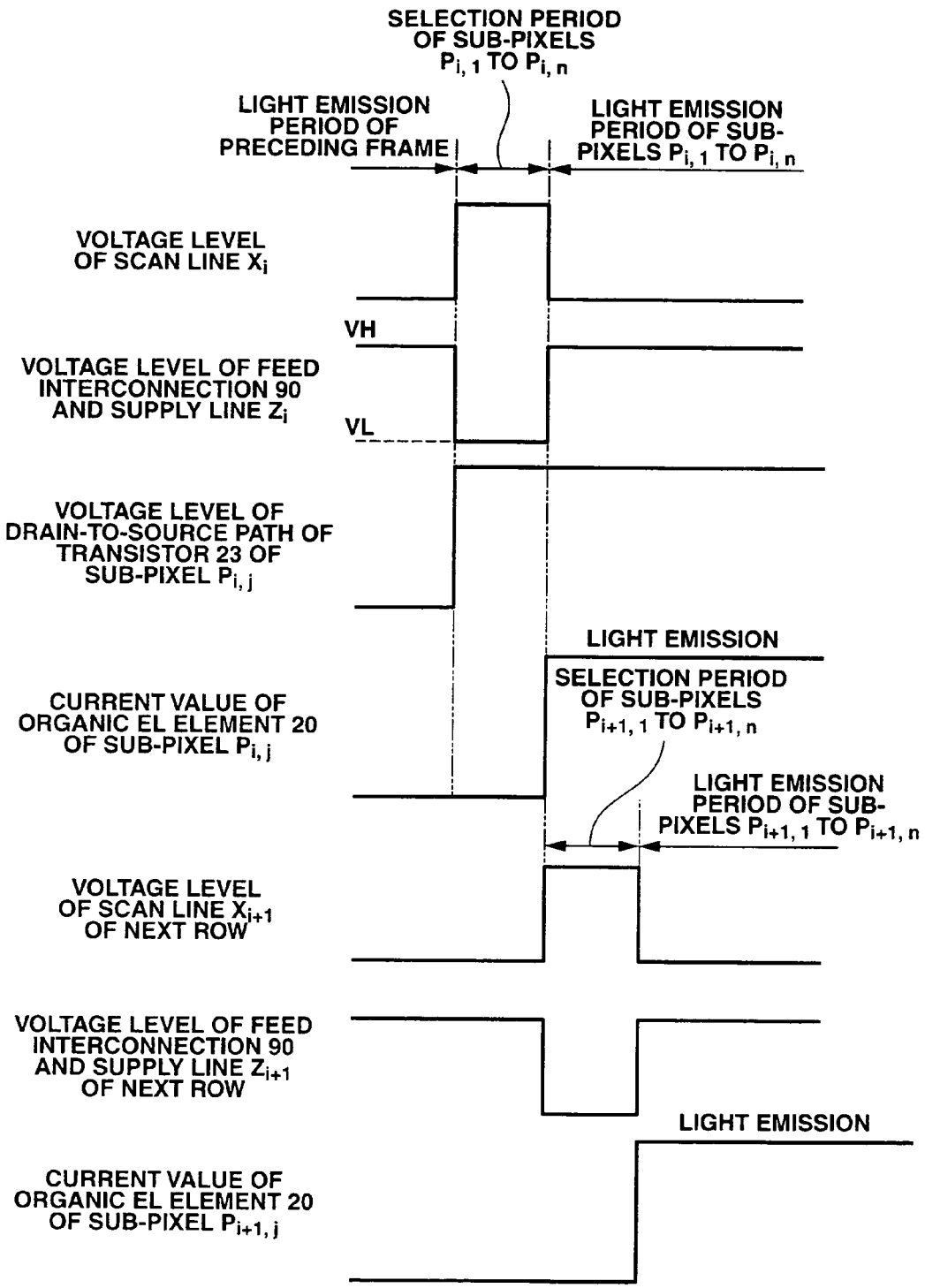
FIG. 9 is a timing chart for explaining the driving method of the display panel shown in FIG. 8.

The first display panel 1 can be driven by the active matrix method in the following way. As shown in FIG. 9, the select driver 111 connected to the scan lines $X_1$ to $X_m$ sequentially outputs a shift pulse of high level to the scan lines $X_1$ to $X_m$ in this order (the scan line $X_1$ next to the scan line $X_m$), thereby sequentially selecting the scan lines $X_1$ to $X_m$. The feed driver 112 applies a write feed voltage VL to supply a write current to the driving transistors 23 connected to the supply lines $Z_1$ to $Z_m$ through the feed interconnections 90 during a selection period. The feed driver 112 applies a driving feed voltage VH to supply a driving current to the organic EL elements 20 through the driving transistors 23 during a light emission period. The feed driver 112 sequentially outputs the write feed voltage VL of low level (lower than the voltage of the counter electrode of the organic EL elements 20) to the supply lines $Z_1$ to $Z_m$ in this order (the supply line $Z_1$ next to the supply line $Z_m$) in synchronism with the select driver 111, thereby sequentially selecting the supply lines $Z_1$ to $Z_m$. While the select driver 111 is selecting the scan lines $X_1$ to $X_m$, a data driver supplies a write current (current signal) to all the signal lines $Y_1$ to $Y_n$ through the drain-to-source paths of the driving transistors 23 of a predetermined row. The counter electrode 20c and common interconnections 91 are connected to an external device through the lead interconnections 95 and terminal portions Tc and held at the predetermined common potential Vcom (e.g., ground=0V).

In each selection period, the potential on the data driver side is equal to or lower than the write feed voltage VL output to the feed interconnections 90 and the supply lines $Z_1$ to $Z_m$. The write feed voltage VL is set to be equal to or lower than the common potential Vcom. At this time, no current flows from the organic EL elements 20 to the signal lines $Y_1$ to $Y_n$. As shown in FIG. 2, a write current (pull-out current) having a current value corresponding to the gray level is supplied from the data driver to the signal lines $Y_1$ to $Y_n$, as indicated by an arrow A. In the sub-pixel $P_{i,j}$, the write current (pull-out current) to the signal line $Y_j$ flows from the feed interconnection 90 and supply line $Z_i$ through the drain-to-source path of the driving transistor 23 and the drain-to-source path of the switch transistor 21. The current value of the current flowing through the drain-to-source path of the driving transistor 23 is uniquely controlled by the data driver. The data driver sets the current value of the write current (pull-out current) in accordance with an externally input gray level. While the write current (pull-out current) is flowing, the voltage between the gate 23g and source 23s of the driving transistor 23 of each of sub-pixels $P_{i,1}$ to $P_{i,n}$ of the ith row is forcibly set in accordance with the current value of the write current (pull-out current) flowing to the signal lines $Y_1$ to $Y_n$, i.e., the current value of the write current (pull-out current) flowing between the drain 23d and source 23s of the driving transistor 23 independently of the change over time in the Vg-Ids characteristic of the transistor 23. Charges with a magnitude corresponding to the level of this voltage are stored in the capacitor 24 so that the current value of the write current (pull-out current) is converted into the voltage level between the gate 23g and source 23s of the driving transistor 23. In the subsequent light emission period, the scan line $X_i$ changes to low level so that the switch transistor 21 and holding transistor 22 are turned off. The charges on the side of the electrode 24A of the capacitor 24 are confined by the holding transistor 22 in the OFF state, and a floating state is set. Hence, even when the voltage of the source 23s of the driving transistor 23 is modulated at the time of transition from the selection period to the light emission period, the potential difference between the gate 23g and source 23s of the transistor 23 is maintained. During the light emission period, the potential of the supply line $Z_i$ and the feed interconnection 90 connected thereto equals the driving feed voltage VH which is higher than the potential Vcom of the counter electrode 20c of the organic EL element 20. Hence, a driving current flows from the supply line $Z_i$ and the feed interconnection 90 connected thereto to the organic EL element 20 in the direction of arrow B through the driving transistor 23. Hence, the organic EL element 20 emits light. The current value of the driving current depends on the voltage between the gate 23g and source 23s of the driving transistor 23. For this reason, the current value of the driving current during the light emission period equals the current value of the write current (pull-out current) during the selection period.

In the structure of the second display panel 1, as shown in FIG. 10, the select driver 111 connected to the scan lines $X_1$ to $X_m$ is arranged in the first peripheral portion of the insulating substrate 2. A lead interconnection 99 which is integrated with the feed interconnections 90 to electrically connect them to each other is arranged in the second peripheral portion of the insulating substrate 2 opposing the first peripheral portion. The lead interconnection 99 receives a clock signal from both terminal portions 90d and 90e located in the third and fourth peripheral portions perpendicular to the first and second peripheral portions.

Figure 11:
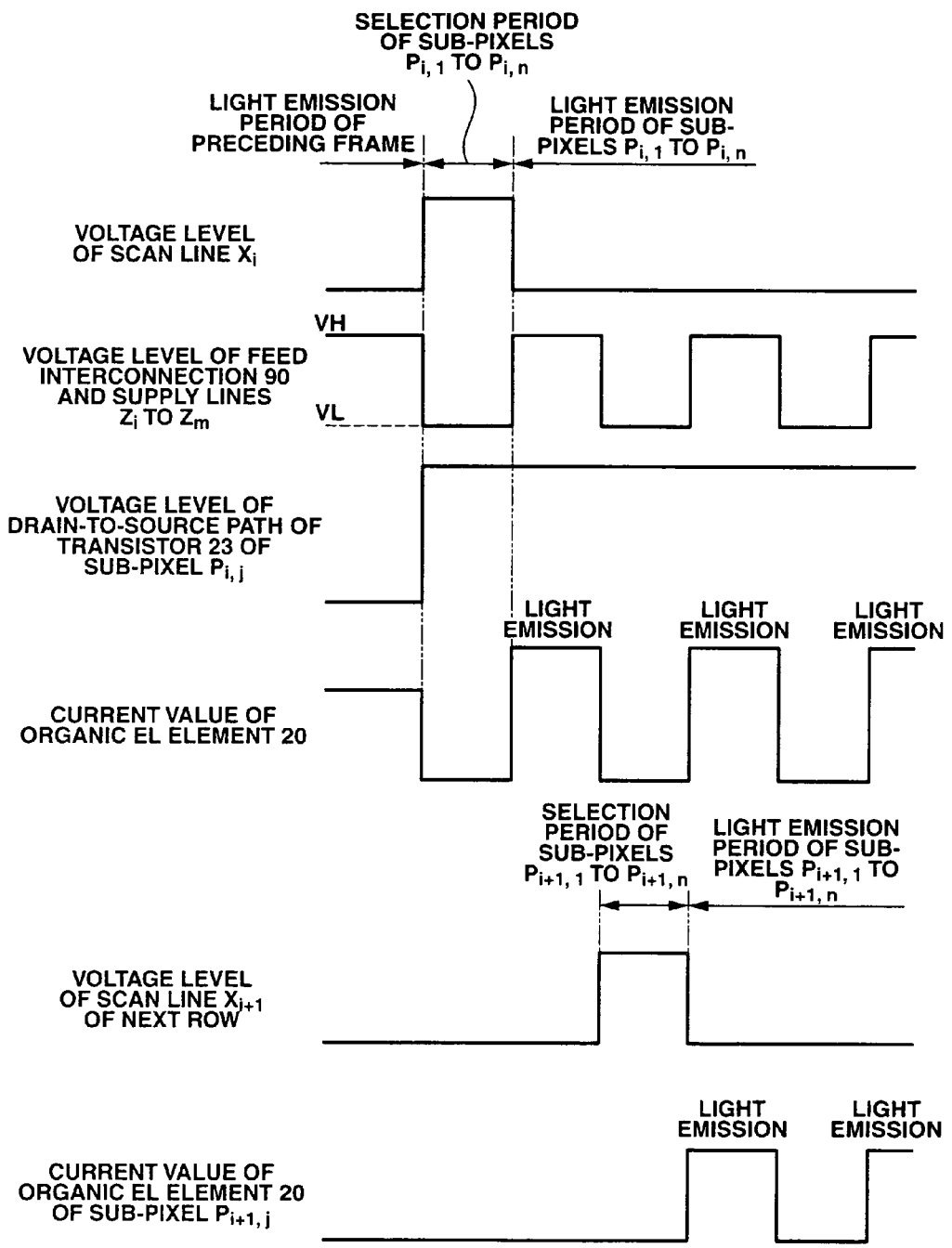
FIG. 11 is a timing chart for explaining the driving method of the display panel shown in FIG. 10.

The active matrix driving method of the second display panel 1 is as follows. As shown in FIG. 11, an external oscillation circuit outputs a clock signal from the terminal portions 90d and 90e to the feed interconnections 90 and supply lines $Z_1$ to $Z_m$ through the lead interconnection 99. The select driver 111 sequentially outputs a shift pulse of high level to the scan lines $X_1$ to $X_m$ in this order (the scan line $X_1$ next to the scan line $X_m$), thereby sequentially selecting the scan lines $X_1$ to $X_m$. While the select driver 111 is outputting the shift pulse of high level, i.e., ON level to one of the scan lines $X_1$ to $X_m$, the clock signal from the oscillation circuit changes to low level. When the select driver 111 selects the scan lines $X_1$ to $X_m$, the data driver supplies a pull-out current (current signal) as the write current to all the signal lines $Y_1$ to $Y_n$ through the drain-to-source paths of the driving transistors 23. The counter electrode 20c and feed interconnections 90 are held at the predetermined common potential Vcom (e.g., ground=0V).

During the selection period of the scan line $X_i$, the shift pulse is output to the scan line $X_i$ of the ith row so that the switch transistor 21 and holding transistor 22 are turned on. In each selection period, the potential on the data driver side is equal to or lower than the clock signal output to the feed interconnections 90 and supply lines $Z_1$ to $Z_m$. The low level of the clock signal is set to be equal to or lower than the common potential Vcom. At this time, no current flows from the organic EL elements 20 to the signal lines $Y_1$ to $Y_n$. As shown in FIG. 2, a write current (pull-out current) having a current value corresponding to the gray level is supplied from the data driver to the signal lines $Y_1$ to $Y_n$, as indicated by the arrow A. In the sub-pixel $P_{i,j}$, the write current (pull-out current) to the signal line $Y_j$ flows from the feed interconnection 90 and supply line $Z_i$ through the drain-to-source path of the driving transistor 23 and the drain-to-source path of the switch transistor 21. The current value of the current flowing through the drain-to-source path of the driving transistor 23 is uniquely controlled by the data driver. The data driver sets the current value of the write current (pull-out current) in accordance with an externally input gray level. While the write current (pull-out current) is flowing, the voltage between the gate 23g and source 23s of the driving transistor 23 of each of the sub-pixels $P_{i,1}$ to $P_{i,n}$ of the ith row is forcibly set in accordance with the current value of the write current (pull-out current) flowing to the signal lines $Y_1$ to $Y_n$, i.e., the current value of the write current (pull-out current) flowing between the drain 23d and source 23s of the driving transistor 23 independently of the change over time in the Vg-Ids characteristic of the transistor 23. Charges with a magnitude corresponding to the level of this voltage are stored in the capacitor 24 so that the current value of the write current (pull-out current) is converted into the voltage level between the gate 23g and source 23s of the driving transistor 23. In the subsequent light emission period, the scan line $X_i$ changes to low level so that the switch transistor 21 and holding transistor 22 are turned off. The charges on the side of the electrode 24A of the capacitor 24 are confined by the holding transistor 22 in the OFF state, and a floating state is set. Hence, even when the voltage of the source 23s of the driving transistor 23 is modulated at the time of transition from the selection period to the light emission period, the potential difference between the gate 23g and source 23s of the driving transistor 23 is maintained. Of the selection period, during a period in which no row is selected, i.e., the clock signal is at high level, and the potential of the feed interconnection 90 and supply line $Z_i$ is higher than the potential Vcom of the counter electrode 20c of the organic EL element 20 and the feed interconnection 90, the driving current flows from the feed interconnection 90 and supply line $Z_i$ with a higher potential to the organic EL element 20 through the drain-to-source path of the driving transistor 23 in the direction of arrow B. Hence, the organic EL element emits light. The current value of the driving current depends on the voltage between the gate 23g and source 23s of the driving transistor 23. For this reason, the current value of the driving current during the light emission period equals the current value of the write current (pull-out current) during the selection period. Of the selection period, during a period in which any row is selected, i.e., the clock signal is at low level, the potential of the feed interconnection 90 and supply line $Z_i$ is equal to or lower than the potential Vcom of the counter electrode 20c and feed interconnection 90. Hence, no driving current flows to the organic EL element 20, and no light emission occurs.

In either driving method, the switch transistor 21 functions to turn on (selection period) and off (light emission period) of the current between the signal line $Y_j$ and the source 23s of the driving transistor 23. The holding transistor 22 functions to make it possible to supply the current between the drain 23d and source 23s of the driving transistor 23 during the selection period and hold the voltage applied to the gate 23g of the transistor 23 during the light emission period. The driving transistor 23 functions to drive the organic EL element 20 by supplying a current having a magnitude corresponding to the gray level to the organic EL element 20.

As described above, the magnitude of the current flowing to the feed interconnection 90 equals the sum of the magnitudes of driving currents flowing to the n organic EL elements 20 connected to the supply lines $Z_i$ of one column. When a selection period to do moving image driving using pixels for VGA or more is set, the parasitic capacitance of each feed interconnection 90 increases. The resistance of an interconnection formed from a thin film which forms the gate electrode or the source/drain electrode of a thin-film transistor such as the first to third transistors 21 to 23 is so high that the write current (driving current) cannot be supplied to the n organic EL elements 20. In this embodiment, the feed interconnections 90 are formed from a conductive layer different from the gate electrodes or the source/drain electrodes of thin-film transistors of the sub-pixels $P_{1,1}$ to $P_{m,n}$. For this reason, the voltage drop by the feed interconnections 90 is small. Even in a short selection period, the write current (pull-out current) can sufficiently be supplied without any delay. Since the resistance of the feed interconnection 90 is lowered by thickening it, the feed interconnection 90 can be made narrow. In a bottom emission structure, the decrease in pixel opening ratio can be minimized.

Similarly, the magnitude of the driving current flowing to the common interconnection 91 during the light emission period equals that of the write current (pull-out current) flowing to the feed interconnection 90 during the selection period. Since the common interconnections 91 use a conductive layer different from that of the gate electrodes or the source/drain electrodes of thin-film transistors of the sub-pixels $P_{1,1}$ to $P_{m,n}$, the common interconnection 91 can be made sufficiently thick, and its resistance can be lowered. In addition, even when the counter electrode 20c itself becomes thin and increases its resistance, the voltage of the counter electrode 20c can be uniformed in the plane. Hence, even if the same potential is applied to all the sub-pixel electrodes 20a, the light emission intensities of the organic EL layers 20b almost equal, and the light emission intensity in the plane can be uniformed. When the EL display panel 1 is used as a top emission type, the counter electrode 20c can be made thinner. Hence, light emitted from the organic EL layer 20b hardly attenuates while passing through the counter electrode 20c. Additionally, since the common interconnections 91 are provided between the sub-pixel electrodes 20a adjacent in the horizontal direction when viewed from the upper side, the decrease in pixel opening ratio can be minimized.

Since the common interconnections 91 are arranged above the signal lines $Y_1$ to $Y_n$ arranged in the non-pixel region between the sub-pixel electrodes 20a, the area of the sub-pixel electrode 20a need not be small.

In the display panel 1 using the driving method of the second display panel 1 of the above-described two driving methods, the feed interconnections 90 are set to an equipotential by the clock signal which is supplied from the external oscillation circuit through the terminal portions 90d and 90e and the lead interconnection 99 in the second peripheral portion of the insulating substrate 2. Hence, the current can quickly be supplied from the organic EL elements 20 to all the feed interconnections 90.

In the first and second EL display panels 1, the common interconnections 91 are connected to each other by the lead interconnections 95 provided in the third and fourth peripheral portions of the insulating substrate 2. The common voltage Vcom is applied to the common interconnections 91. The common interconnections 91 and lead interconnections 95 are electrically insulated from the scan lines $X_1$ to $X_m$, signal lines $Y_1$ to $Y_n$, and supply lines $Z_1$ to $Z_m$.

[First Modification]

In this embodiment, the three transistors 21 to 23 are N-channel field effect transistors. Instead, they may be P-channel field effect transistors. In this case, the relationship between the sources 21s, 22s, and 23s and the drains 21d, 22d, and 23d of the transistors 21 to 23 is reversed in the circuit diagram shown in FIG. 2. For example, when the driving transistor 23 is a P-channel field effect transistor, the drain 23d of the transistor 23 is electrically connected to the sub-pixel electrode 20a of the organic EL element 20. The source 23s is electrically connected to the supply line Z. In addition, the waveform of the driving signal has an opposite phase.

[Second Modification]

In this embodiment, the signal line Y is patterned from the gate layer. Instead, the signal line Y may be patterned from the drain layer. In this case, the scan line X and supply line Z are patterned from the gate layer, and the signal line Y is arranged above the scan line X and supply line Z.

[Third Modification]

In this embodiment, the three transistors 21, 22, and 23 are provided in each 1-dot sub-pixel P. Instead, one or a plurality of transistors may be provided in each 1-dot sub-pixel P so that the display panel can be driven by the active matrix method by using these transistors.

[Fourth Modification]

In this embodiment, the pixel 3 includes the three sub-pixels Pr, Pg, and Pb. Instead, the pixel 3 may include sub-pixels of halftones of red, green, and blue.

[Fifth Modification]

In this embodiment, the counter electrode 20c is used as the cathode of the organic EL element 20, and the sub-pixel electrode 20a is used as the anode of the organic EL element 20. However, the counter electrode 20c may be used as the anode of the organic EL element 20, and the sub-pixel electrode 20a may be used as the cathode of the organic EL element 20.

What is claimed is:

1. A display panel comprising:
   a substrate;
   a plurality of sets of transistors which are formed on an upper side of the substrate;
   an insulating film, which is formed to cover upper surfaces of said transistors, and which has a plurality of trenches formed in an upper surface thereof;
   a plurality of first interconnections which are buried in the trenches, and which extend along a row direction;
   an interconnection insulating film which covers upper surfaces of said plurality of first interconnections;
   a plurality of second interconnections which are provided on an upper side of the interconnection insulating film, and which extend along a column direction across the first interconnections;
   a plurality of pixel electrodes, each of which is provided between two adjacent interconnections of said plurality of second interconnections;
   a plurality of light-emitting layers, each of which is provided on one of the pixel electrodes; and
   a counter electrode which is provided on the light-emitting layers and which is connected to the second interconnections.

2. A panel according to claim 1, wherein each said set of transistors comprises a driving transistor in which one of the source and the drain is connected to one of the pixel electrodes, a switch transistor which supplies a write current between the source and the drain of the driving transistor, and a holding transistor which holds a voltage between the gate and the source of the driving transistor during a light emission period.

3. A panel according to claim 2, wherein the first interconnections comprise a feed interconnection which is connected to the other of the source and the drain of the driving transistor.

4. A panel according to claim 1, wherein each of the first interconnections further includes a conductive line formed by patterning the conductive layer serving as the pixel electrodes, the conductive line being connected with the conductive material.

5. A panel according to claim 1, wherein the insulating film comprises a transistor protective insulating film which directly covers said transistors.

6. A panel according to claim 5, wherein the insulating film comprises a planarization film which is provided on the transistor protective insulating film.

7. A panel according to claim 1, wherein the second interconnections are formed from a conductive layer different from the conductive layer serving as the gate of each of said transistors and the conductive layer serving as the source and the drain of each of said transistors.

8. A panel according to claim 1, wherein the second interconnections comprise a conductive material.

9. A panel according to claim 1, wherein said plurality of pixel electrodes include a first group of the pixel electrodes and a second group of the pixel electrodes, and wherein one of the first interconnections supplies currents to the first group of the pixel electrodes via the transistors.

10. A panel according to claim 1, wherein each of the first interconnections includes a conductive material which is formed from a conductive layer different from a conductive layer serving as the pixel electrodes, a conductive layer serving as a gate of each of the transistors and a conductive layer serving as a source and a drain of each of the transistors.

* * * * *